United States Patent
Matsumoto et al.

(10) Patent No.: US 8,171,371 B2
(45) Date of Patent: May 1, 2012

(54) INSPECTION MATRIX GENERATION METHOD, ENCODING METHOD, COMMUNICATION DEVICE, COMMUNICATION SYSTEM, AND ENCODER

(75) Inventors: Wataru Matsumoto, Tokyo (JP); Rui Sakai, Tokyo (JP); Hideo Yoshida, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 962 days.

(21) Appl. No.: 12/097,390

(22) PCT Filed: Dec. 13, 2006

(86) PCT No.: PCT/JP2006/324869
§ 371 (c)(1), (2), (4) Date: Jun. 13, 2008

(87) PCT Pub. No.: WO2007/072721
PCT Pub. Date: Jun. 28, 2007

(65) Prior Publication Data
US 2009/0164864 A1 Jun. 25, 2009

(30) Foreign Application Priority Data
Dec. 20, 2005 (JP) .................... 2005-367077

(51) Int. Cl.
*G06F 11/00* (2006.01)
(52) U.S. Cl. .................... 714/758
(58) Field of Classification Search .................... None
See application file for complete search history.

(56) References Cited

U.S. PATENT DOCUMENTS 7,620,873 B2 * 11/2009 Kanaoka et al. ............ 714/752
8,024,641 B2 * 9/2011 Livshitz et al. ............ 714/758

FOREIGN PATENT DOCUMENTS

| EP | 1 924 001 A1 | 5/2008 |
| JP | 2005 312061 | 11/2005 |
| WO | 2004 107640 | 12/2004 |
| WO | 2005 107081 | 11/2005 |
| WO | 2007 018066 | 2/2007 |

OTHER PUBLICATIONS

U.S. Appl. No. 12/063,507, filed Feb. 11, 2008, Matsumoto, et al.
U.S. Appl. No. 12/160,432, filed Jul. 10, 2008, Matusmoto, et al.
U.S. Appl. No. 12/278,185, filed Aug. 4, 2008, Matsumoto et al.

(Continued)

*Primary Examiner* — Michael Maskulinski
(74) *Attorney, Agent, or Firm* — Oblon, Spivak, McClelland, Maier & Neustadt, L.L.P.

(57) ABSTRACT

A regular qc matrix is generated in which cyclic permutation matrices with specific regularity are arranged in row and column directions. A mask matrix supporting multiple encoding rates is generated for making the regular qc matrix into irregular. A specific cyclic permutation matrix in the regular qc matrix is converted into a zero-matrix using a mask matrix corresponding to a specific encoding rate to generate an irregular masking qc matrix. An irregular parity check matrix with a LDGM structure is generated, in which the masking qc matrix and a matrix in which the cyclic permutation matrices are arranged in a staircase manner are arranged in a predetermined location.

21 Claims, 15 Drawing Sheets

OTHER PUBLICATIONS

Hachiro Fujita, et al., "An Algebraic Method for Constructing Efficiently Encodable Irregular LDPC Codes", Proceedings IEEE International Symposium on Information Theory, XP010845663, Sep. 4, 2005, 5 pages.

Y. Y. Tai, et al., "Construction of Structured LDPC Codes for AWGN and Binary Erasure Channels", International Conference on Wireless Networks, Communications and Mobile Computing, vol. 1, XP010887950, Jun. 13, 2005, pp. 146-151.

Sundararajan Sankaranarayanan, et al., "A Systematic Construction of Irregular Low-Density Parity-Check Codes from Combinatorial Designs", Proceedings IEEE International Symposium on Information Theory, XP010657029, Jun. 29, 2003, pp. 1-1.

U.S. Appl. No. 12/376,344, filed Feb. 4, 2009, Matsumoto, et al.

Mitsubishi Electrical Corporation, NTT DoCoMo, "Rate-Compatible LDPC Codes With Low Complexity Encoder & Decoder", 3GPP TSG RAN WG1 #43 R1-051383 (2005).

Kim, Y.H. et al., "Erasure Decoding for LDPC-Coded FH-OFDMA System in Downlink Cellular Environments", Electronics Letters, vol. 40, No. 22 (2004).

Johnson, Sarah J. et al., "A Family of Irregular LDPC Codes With Low Encoding Complexity", IEEE Communications Letters, vol. 7, No. 2, pp. 79-81 (2003).

Fossorier, M, "Quasi-Cyclic Low Density Parity Check Codes", ISIT, p. 150 (2003).

\* cited by examiner

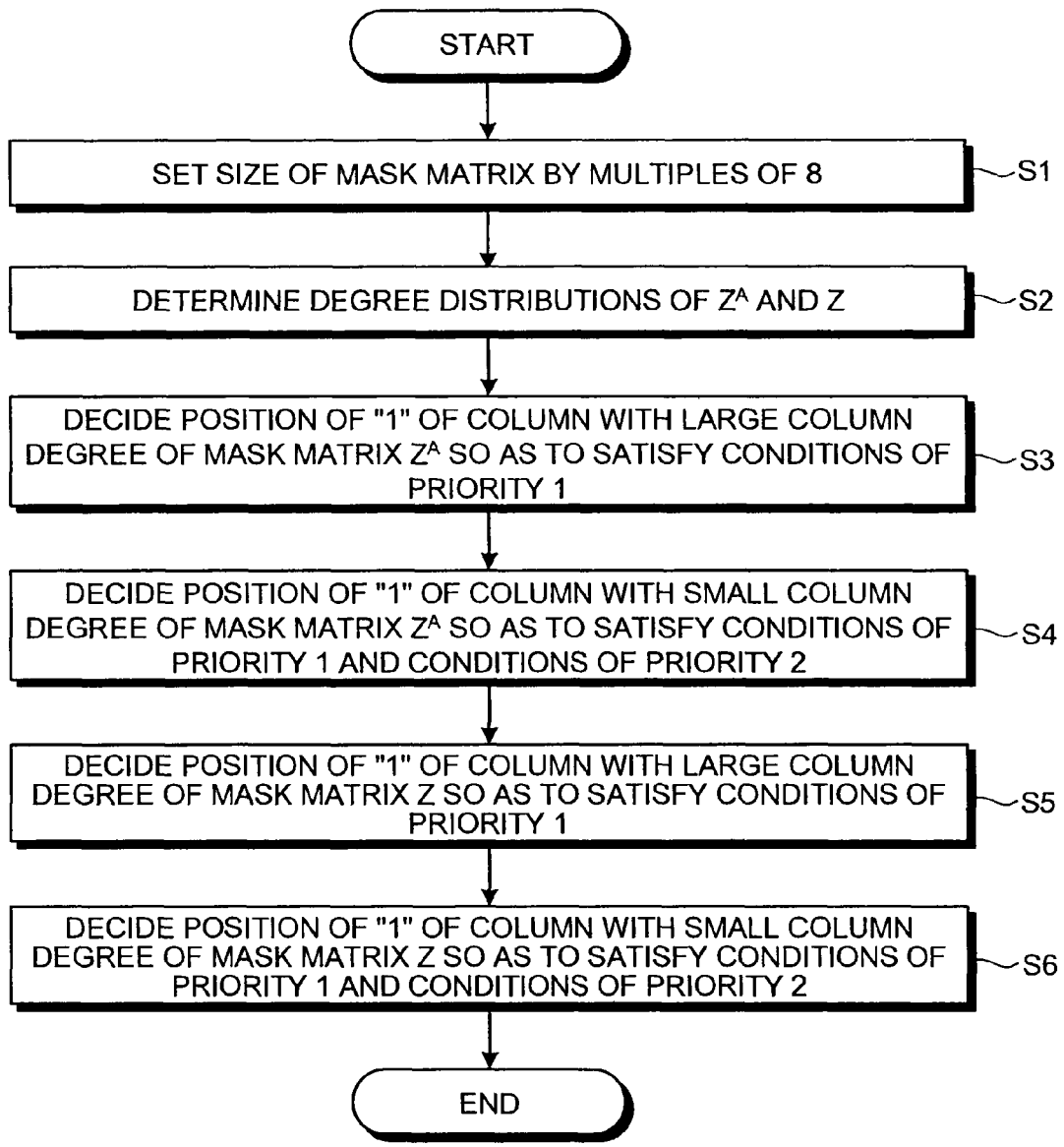

| | COLUMN DEGREE | | | | DIFFERENCE TO SHANNON LIMIT (dB) |
|---|---|---|---|---|---|
| | 14 | 4 | 3 | 2 | |
| DEGREE DISTRIBUTION OF $H_{M(1/2)}$ | 5/64 | 18/64 | 9/64 | 32/64 | 0.546 |

| | COLUMN DEGREE OF $H_{M(1/2)}$ | | | | |
|---|---|---|---|---|---|
| RATIO OF COLUMN DEGREE OF $H_{M(1/2)}$ (FIX) | 14 | 4 | 3 | 2 | |
| | 5/64 | 18/64 | 9/64 | 32/64 | |

| | COLUMN DEGREE OF $H_M$ | | | | | DIFFERENCE TO SHANNON LIMIT (dB) |
|---|---|---|---|---|---|---|
| | 28 | 8 | 4 | 3 | 1 | |
| DEGREE DISTRIBUTION OF $H_{M(1/3)}$ | 5/96 | 10/96 | 8/96 | 41/96 | 32/96 | 0.486 |

COLUMN DEGREE 14
COLUMN DEGREE 4
COLUMN DEGREE 3
COLUMN DEGREE 2

FIG.9

| | COLUMN DEGREE OF $H_M$ | | | | | | | DIFFERENCE TO SHANNON LIMIT (dB) |
|---|---|---|---|---|---|---|---|---|
| | 14·9 | 4·9 | 4·2 | 4 | 3 | 2 | 1 | |
| DEGREE DISTRIBUTION OF $H_M$ | 5/(32*10) | 10/(32*10) | 0/(32*10) | 8/(32*10) | 41/(32*10) | (32*7)/(32*10) | 32/(32*10) | 0.227 |

| 1 | | | | | 1 | | | | | 1 | | | | | 1 | | | | | 1 | | | | |
|---|---|---|---|---|---|---|---|---|---|---|---|---|---|---|---|---|---|---|---|---|---|---|---|---|
| | 1 | | | | | 1 | | | | | 1 | | | | | 1 | | | | | 1 | | | |
| | | 1 | | | | | 1 | | | | | 1 | | | | | 1 | | | | | 1 | | |
| | | | 1 | | | | | 1 | | | | | 1 | | | | | 1 | | | | | 1 | |
| | | | | 1 | | | | | 1 | | | | | 1 | | | | | 1 | | | | | 1 |
| 1 | | | | | | 1 | | | | | | 1 | | | | 1 | | | | | | | | 1 |
| | 1 | | | | | | 1 | | | | | | 1 | | | | | | | 1 | 1 | | | |
| | | 1 | | | | | | 1 | | 1 | 1 | | | | | | | | | | | 1 | | |
| | | | 1 | | 1 | | | | | | | | | 1 | | | | | | | | | 1 | |
| | | | | 1 | | 1 | | | | | | | | | | | | 1 | | | | | | 1 |
| 1 | | | | | | | 1 | | | | | 1 | | | | 1 | | | | 1 | | | | |
| | 1 | | | | | 1 | | | | 1 | 1 | | | | | | | | | | 1 | | | |
| | | | 1 | 1 | | | | | | | | | | 1 | | | | | | | | | 1 | |
| | | 1 | | | 1 | | | | | | | | 1 | | | | | | | 1 | | | | |
| | | | | 1 | | 1 | | | | | | 1 | | | | | 1 | | | | | | | 1 |

INSPECTION MATRIX GENERATION METHOD, ENCODING METHOD, COMMUNICATION DEVICE, COMMUNICATION SYSTEM, AND ENCODER

TECHNICAL FIELD

The present invention relates to an encoding technology in digital communications, in particular to a check-matrix generating method of generating a parity check matrix for low-density parity check (LDPC) codes, an encoding method of encoding predetermined information bits using the parity check matrix, and a communication apparatus.

BACKGROUND ART

Hereinafter, a conventional communication system that employs LDPC codes as an encoding system will be explained. Here, a case in which quasi-cyclic (QC) codes (see Non-patent Document 1) are employed as one example of the LDPC codes will be explained.

First, a flow of encoding/decoding processing in the conventional communication system that employs the LDPC codes as the encoding system will be explained briefly.

An LDPC encoder in a communication apparatus on a transmission-side (it is called a transmission apparatus) generates a parity check matrix H by a conventional method that will be explained below. Further, the LDPC encoder generates, for example, a generator matrix G with K-row×N-column (K: information length, N: code length). Note that when the parity check matrix for LDPC is defined as H (M-row×N-column), the generator matrix G will be a matrix that satisfies $GH^T=0$ (T is a transposed matrix).

Thereafter, the LDPC encoder receives messages ($m_1, m_2, \ldots, m_K$) with the information length K to generate a code C as represented by following Equation (1) using these messages and the generator matrix G, where $H(c_1, c_2, \ldots, c_N)^T=0$.

$$C = (m_1, m_2, \ldots, m_K)G \qquad (1)$$
$$= (c_1, c_2, \ldots, c_N)$$

A modulator in the transmission apparatus then performs digital modulation to the code C generated by the LDPC encoder according to a predetermined modulation system, such as binary phase shift keying (BPSK), quadrature phase shift keying (QPSK), multi-value quadrature amplitude modulation (QAM), and transmits a modulated signal $x=(x_1, x_2, \ldots, x_N)$ to a reception apparatus.

Meanwhile, in a communication apparatus on a reception-side (which is called a reception apparatus), a demodulator performs digital demodulation to a received modulated signal $y=(y_1, y_2, \ldots, y_N)$ according to the modulation system such as BPSK, QPSK, multi-value QAM, or the like, and an LDPC decoder in the reception apparatus further performs repetition decoding to demodulated results based on a "sum-product algorithm" to thereby output the decoded results (corresponding to the original messages $m_1, m_2, \ldots, m_K$).

The conventional parity check-matrix generating method for the LDPC codes will now be explained concretely. As the parity check matrix for the LDPC codes, a following parity check matrix of QC codes is proposed, for example, in following Non-patent Document 1 (see FIG. 20). The parity check matrix of the QC codes shown in FIG. 20 is a matrix in which cyclic permutation matrices (P=5) with 5-row×5-column are arranged in a vertical direction (J=3) and in a horizontal direction (L=5).

Generally, a parity check matrix $H_{QC}$ of the (J, L) QC codes with M (=pJ) rows×N (=pL) columns can be defined as following Equation (2). Incidentally, p is an odd prime number (other than 2), L is the number of cyclic permutation matrices in the parity check matrix $H_{QC}$ in a transverse direction (column direction), and J is the number of cyclic permutation matrices in the parity check matrix $H_{QC}$ in a longitudinal direction (row direction)

[Numerical Expression 1]

$$H_{QC} = \begin{bmatrix} I(p_{0,0}) & I(p_{0,1}) & \cdots & I(p_{0,L-1}) \\ I(p_{1,0}) & I(p_{1,1}) & \cdots & I(p_{1,L-1}) \\ \vdots & \vdots & \ddots & \vdots \\ I(p_{J-1,0}) & I(p_{J-1,1}) & \cdots & I(p_{J-1,L-1}) \end{bmatrix} \qquad (2)$$

$$\text{example: } p = 5, I(0) = \begin{bmatrix} 1 & 0 & 0 & 0 & 0 \\ 0 & 1 & 0 & 0 & 0 \\ 0 & 0 & 1 & 0 & 0 \\ 0 & 0 & 0 & 1 & 0 \\ 0 & 0 & 0 & 0 & 1 \end{bmatrix}$$

Where, in $0 \leq j \leq J-1$ and $0 \leq l \leq L-1$, $I(p_{j,l})$ are cyclic permutation matrices in which positions of a row index: r ($0 \leq r \leq P-1$), and a column index: "$(r+p_{j,l}) \mod p$" are "1", and other positions are "0".

In addition, when the LDPC codes are designed, performance degradation generally occurs when there are many loops with a short length, and thus it is necessary to increase an internal diameter and to reduce the number of loops with the short length (loop 4, loop 6, or the like).

Incidentally, FIG. 21 is a view showing one example of the check matrix represented by a Tanner graph, wherein in the binary parity check matrix H of {0,1} with M-row×N-column, nodes corresponding to each column are called bit nodes $b_n$ ($1 \leq n \leq N$) (corresponding to circles in the figure), and nodes corresponding to each row are called check nodes $c_m$ ($1 \leq m \leq M$) (corresponding to rectangles in the figure), and further, when there is "1" at an intersection of the row and the column of the check matrix, a bipartite graph in which the bit nodes and the check nodes are connected with branches is called the Tanner graph. In addition, the loop represents a closed loop that starts from a specific node (corresponding to circles and rectangles in the figure) and ends at that node as shown in FIG. 21, and the internal diameter means the minimum loop thereof. Moreover, a loop length is represented by the number of branches constituting the closed loop, and is simply represented as loop 4, loop 6, loop 8, . . . according to the length.

Meanwhile, in following Non-patent Document 1, a range of an internal diameter g in the parity check matrix $H_{QC}$ of (J,L) QC-LDPC codes is given by "$4 \leq g \leq 12$ (where g is an even number)". However, it is easy to avoid g=4 and, and it results in $g \geq 6$ in many cases.

Non-patent Document 1: M. Fossorier, "quasi-cyclic Low Density Parity Check Code", ISIT2003, p. 150, Japan, Jun. 29-Jul. 4, 2003.

DISCLOSURE OF INVENTION

Problem to be Solved by the Invention

According to the conventional technology, however, while codes equal to loop 6 or more can be easily constituted with a regular configuration, a regular (weights of the row and the column are uniform) parity check matrix for the LDPC codes is generated, so that there is a problem that an irregular (weights of the row and the column are nonuniform) parity check matrix that is generally considered to have excellent performance is not specified.

Additionally, it is necessary to prepare the generator matrix G aside from the check matrix H upon encoding, so that there is a problem that an additional circuit for calculating the generator matrix G is required. Moreover, it is necessary to prepare the check matrixes H corresponding to the number of encoding rates in dealing with a plurality of encoding rates, so that there is a problem that the circuit scale is further increased.

The present invention is made in view of the situation, and aims at obtaining a communication apparatus that can deal with the irregular (weights of the row and the column are nonuniform) parity check matrix for the LDPC codes, and whose circuit scale can be further reduced as compared with that of the conventional technology.

Means for Solving Problem

To solve the above problems and to achieve the object, a check-matrix generating method for generating a parity check matrix for low-density parity check (LDPC) codes, according to the present invention, includes a quasi-cyclic matrix generating step of generating a regular (weights of a row and a column are uniform) quasi-cyclic matrix in which cyclic permutation matrices are arranged in a row direction and a column direction and specific regularity is given to the cyclic permutation matrices; a mask-matrix generating step of generating a mask matrix for making the regular quasi-cyclic matrix into irregular (weights of a row and a column are nonuniform), the mask matrix capable of supporting a plurality of encoding rates; a masking step of converting a specific cyclic permutation matrix in the regular quasi-cyclic matrix into a zero-matrix using a mask matrix corresponding to a specific encoding rate to generate an irregular masking quasi-cyclic matrix; and a check-matrix generating step of generating an irregular parity check matrix with a low-density generation matrix (LDGM) structure in which the masking quasi-cyclic matrix and a matrix in which the cyclic permutation matrices are arranged in a staircase manner are arranged in a predetermined location.

Effect of the Invention

According to the present invention, a predetermined masking rule for generating the irregular matrix is applied to the regular quasi-cyclic matrix in which the specific regularity is given, allowing the irregular parity check matrix with the LDGM structure to be easily generated. Moreover, it is not necessary to generate the generator matrix G as is necessary in the conventional technology, allowing the circuit scale to be greatly reduced.

BRIEF DESCRIPTION OF DRAWINGS

FIG. 2-1 is a view showing a configuration of a product-sum operation unit in code generation.

FIG. 2-2 is a view showing a configuration example of a code generating unit using the product-sum operation unit shown in FIG. 2-1.

FIG. 3 is a flow chart showing mask-matrix generation processing according to the first embodiment.

FIG. 9 is a view showing an example of a column degree distribution of an irregular parity check matrix $H_M$ corresponding to codes of an encoding rate of $1/10$.

FIG. 16-1 is a view for explaining an erasure correction encoding decoding-method according to the sixth embodiment.

FIG. 16-2 is a view for explaining the erasure correction encoding decoding-method according to the sixth embodiment.

FIG. 16-3 is a view for explaining the erasure correction encoding decoding-method according to the sixth embodiment.

EXPLANATIONS OF LETTERS OR NUMERALS

1: LDPC encoder
2: Modulator
3: Communication channel
4: Demodulator
5: LDPC decoder
51: Product-sum operation unit

BEST MODE(S) FOR CARRYING OUT THE INVENTION

Hereinafter, embodiments of a check-matrix generating method according to the present invention will be explained in detail based on the drawings. Incidentally, the present invention is not limited by these embodiments.

First Embodiment

Figure 1:
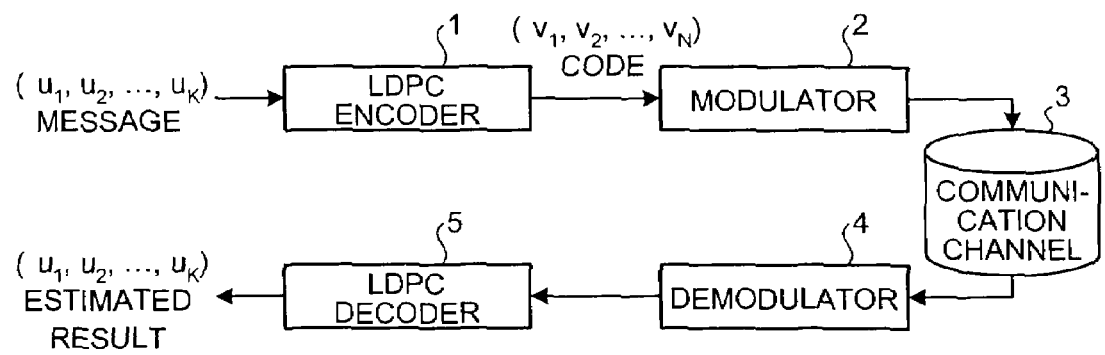
FIG. 1 is a view showing a configuration example of a communication system including an LDPC encoder and an LDPC decoder according to the present embodiment.

FIG. 1 is a view showing a configuration example of a communication system including an LDPC encoder and an LDPC decoder according to the present embodiment. In FIG. 1, a communication apparatus (which is called a transmission apparatus) on a transmission-side has a configuration including an LDPC encoder 1 and a modulator 2, and a communication apparatus (which is called a reception apparatus) on a reception-side has a configuration including a demodulator 4 and an LDPC decoder 5.

Here, a flow of encoding processing and decoding processing in the communication system that employs LDPC codes will be explained briefly.

The LDPC encoder 1 in the transmission apparatus generates a parity check matrix generated by a check-matrix generating method according to the present embodiment, namely, a parity check matrix $H_M$ with M-row×N-column to which masking processing is performed based on a predetermined masking rule described below.

Thereafter, the LDPC encoder 1 receives a message ($u_1, u_2, \ldots u_K$) with an information length K to generate a code v with a length N using this message and the parity check matrix $H_M$ as represented by following Equation (3). It should be noted that in the present embodiment, the encoding processing of information bits is performed without using the generator matrix G (K: information length, N: code length) calculated in the conventional technology.

$$v = \{(v_1, v_2, \ldots, v_n) \epsilon GF(2) | (v_1, v_2, \ldots, v_n) H_M^T = 0\} \quad (3)$$

The modulator 2 in the transmission apparatus then digital-modulates the code v generated by the LDPC encoder 1 according to a predetermined modulation system, such as BPSK, QPSK, and multi-value QAM, and transmits the modulated signal $x = (x_1, x_2, \ldots, x_N)$ to the reception apparatus to a communication channel 3.

Meanwhile, in the reception apparatus, the demodulator 4 digital-demodulates a modulated signal $y = (y_1, y_2, \ldots, y_N)$ received via the communication channel 3 according to a modulation system, such as the BPSK, QPSK, and multi-value QAM, and the LDPC decoder 5 in the reception apparatus further performs repetition decoding with a well-known decoding algorithm to thereby output the decoded result (corresponding to the original message $u_1, u_2, \ldots, u_K$).

Subsequently, the check-matrix generating method according to the present embodiment will be explained in detail. Incidentally, in the present embodiment, it is supposed that an irregular (weight distribution is nonuniform) parity check matrix is generated, and it is premised that an LDGM (low-density generation matrix) structure is employed as the structure. Moreover, check matrix generation processing of each embodiment explained hereinafter may be performed by the LDPC encoder 1 in the communication apparatus, or may be performed in advance outside the communication apparatus. When it is performed outside the communication apparatus, the generated check matrix is stored in an internal memory.

First, a parity check matrix $H_{QCL}$ of QC-LDPC codes with the LDGM structure, which is a premise for the irregular parity check matrix $H_M$ after the masking processing and is generated by the check matrix generation processing of the present embodiment, will be defined.

For example, the parity check matrix $H_{QCL}$ $(=[h_{m,n}])$ of the QC-LDPC codes with the LDGM structure of M $(=pJ)$ rows×N $(=pL+pJ)$ columns can be defined as following Equation (4-1).

[Numerical Expression 2-1]

$$H_{QCL} := \begin{bmatrix} I(p_{0,0}) & I(p_{0,1}) & \cdots & I(p_{0,L-1}) & I(0) & 0 & \cdots & \cdots & \cdots & \cdots & \cdots & 0 \\ I(p_{1,0}) & I(p_{1,2}) & \cdots & I(p_{1,L-1}) & I(0) & I(0) & 0 & \ddots & \ddots & \ddots & \ddots & \vdots \\ \vdots & \vdots & \vdots & \vdots & 0 & \ddots & \ddots & \ddots & \ddots & \ddots & \ddots & \vdots \\ I(p_{J/2-1,0}) & I(p_{J/2-1,2}) & \cdots & I(p_{J/2-1,L-1}) & \vdots & \ddots & I(0) & I(0) & 0 & \ddots & \ddots & \vdots \\ \vdots & \vdots & \vdots & \vdots & I(0) & 0 & \cdots & 0 & I(0) & 0 & \ddots & \vdots \\ \vdots & \vdots & \vdots & \vdots & 0 & I(0) & 0 & \ddots & \ddots & I(0) & \ddots & \vdots \\ \vdots & \vdots & \vdots & \vdots & \vdots & \ddots & \ddots & \ddots & \ddots & \ddots & \ddots & 0 \\ I(p_{J-1,0}) & I(p_{J-1,2}) & \cdots & I(p_{J-1,L-1}) & 0 & \cdots & 0 & I(0) & 0 & \cdots & 0 & I(0) \end{bmatrix} \quad (4-1)$$

Here, $h_{m,n}$ represents an element at a row index m and a column index n in the parity check matrix $H_{QCL}$. Additionally, in $0 \leq j \leq J-1$ and $0 \leq l \leq L-1$, $I(p_{j,l})$ are cyclic permutation matrices in which positions of a row index: r $(0 \leq r \leq p-1)$, and a column index: "$(r+p_{j,l}) \mod p$" are "1", and other positions are "0". For example, I (1) can be represented as following Equation (4-2).

[Numerical Expression 2-2]

$$I(1) = \begin{bmatrix} 0 & 1 & 0 & \cdots & 0 \\ 0 & 0 & 1 & \cdots & 0 \\ \cdots & \cdots & \cdots & \cdots & \cdots \\ 0 & 0 & 0 & \cdots & 1 \\ 1 & 0 & 0 & \cdots & 0 \end{bmatrix} \quad (4-2)$$

In the parity check matrix $H_{QCL}$, a left-hand side matrix (a portion corresponding to information bits) is a quasi-cyclic matrix $H_{QC}$ that is the same as the parity check matrix of QC codes shown by Equation (2), and a right-hand side matrix (a portion corresponding to parity bits) is a matrix $H_T$ or $H_D$ in which I(0) are arranged in a staircase manner as shown in following Equation (5-1) or Equation (5-2).

[Numerical Expression 3-1]

$$H_T := \begin{bmatrix} I(0) & 0 & \cdots & \cdots & \cdots & \cdots & \cdots & 0 \\ I(0) & I(0) & 0 & \ddots & \ddots & \ddots & \ddots & \vdots \\ 0 & \ddots & \ddots & \ddots & \ddots & \ddots & \ddots & \vdots \\ \vdots & \ddots & I(0) & I(0) & 0 & \ddots & \ddots & \vdots \\ I(0) & 0 & \cdots & 0 & I(0) & 0 & \ddots & \vdots \\ 0 & I(0) & 0 & \ddots & \ddots & I(0) & \ddots & \vdots \\ \vdots & \ddots & \ddots & \ddots & \ddots & \ddots & \ddots & 0 \\ 0 & \cdots & 0 & I(0) & 0 & \cdots & 0 & I(0) \end{bmatrix} \quad (5\text{-}1)$$

[Numerical Expression 3-2]

$$H_D := \begin{bmatrix} I(0) & 0 & \cdots & \cdots & 0 \\ I(0) & I(0) & 0 & \ddots & \vdots \\ 0 & \ddots & \ddots & \ddots & \vdots \\ \vdots & \ddots & I(0) & I(0) & 0 \\ 0 & \cdots & 0 & I(0) & I(0) \end{bmatrix} \quad (5\text{-}2)$$

However, the cyclic permutation matrices used in the staircase structure are not necessarily limited to I(0), but may be a combination of arbitrary $I(s|s \in [0, p-1])$.

Note that, the LDGM structure means a structure in which a part of the parity check matrix is formed into a lower triangular matrix as the matrix shown in Equation (4-1). Encoding can be achieved easily by using this structure without using the generator matrix G. For example, when the systematic code v is represented as following Equation (6), and the information message $u=(u_1, u_2, \ldots, u_K)$ is given, parity elements $p_m=(p_1, p_2, \ldots, p_M)$ are generated so that "$H_{QCL} \cdot v^T = 0$" may be satisfied, namely as following Equation (7).

$$v = (v_1, v_2, \ldots v_K, v_{K+1}, v_{K+2}, \ldots, v_N) \quad (6)$$
$$= (u_1, u_2, \ldots u_K, p_1, p_2, \ldots, p_M)$$

where N=K+M.

[Numerical Expression 4]

$$p_m = \sum_{n=1}^{K+m-1} v_n h_{m,n}, \ 1 \leq m \leq M, \ 1 \leq n \leq N \quad (7)$$

Further, in the present embodiment, a specific regularity is provided in the parity check matrix $H_{QCL}$ of the QC-LDPC codes with the LDGM structure defined as the Equation (4-1). Specifically, in the $H_{QC}$ portion of the quasi-cyclic matrix on the left-hand side of the parity check matrix $H_{QCL}$, a specific regularity is provided to $p_{j,l}$ of the cyclic permutation matrices $I(p_{j,l})$ with p-row×p-column arranged at a row index j (=0, 1, 2, ..., J−1) and a column index l (=0, 1, 2, ..., L−1) so as to satisfy following Equation (8-1) or following Equation (8-2).

$$p_{j,l} = j(l+1) \bmod p \quad (8\text{-}1)$$

$$p_{j,l} = (j+1)(l+1) \bmod p \quad (8\text{-}2)$$

Additionally, a specific regularity may be provided to $p_{j,l}$ of the cyclic permutation matrices $I(p_{j,l})$ to satisfy following Equation (9-1) or following Equation (9-2), where $p_{0,1}$ is an arbitrary integer.

$$p_{j,l} = p_{0,1}(j+1) \bmod p \quad (9\text{-}1)$$

$$p_{j,l} = ((p-p_{0,1})(j+1)) \bmod p \quad (9\text{-}2)$$

Incidentally, in the present embodiment, another regularity that can be composed of parameters, such as j, l, $p_{j,l}$ may be provided, without limiting to Equation (8-1), Equation (8-2), Equation (9-1), and Equation (9-2).

As described above, in the present embodiment, the regularity that can specify $p_{j,l}$ by the row index j and the column index l of the cyclic permutation matrix, or the regularity that can specify $p_{j,l}$, while setting $p_{0,1}$ of a specific row index, specifically row index j=0, to an arbitrary integer, by the other row index j is provided. As a result, even when the number of rows of the quasi-cyclic matrix $H_{QC}$ is increased, it is not necessary to store $p_{j,l}$ of the whole $H_{QC}$, as will be below described.

Additionally, it is not necessary to store anything about the quasi-cyclic matrix $H_{QC}$ when Equation (8-1) or Equation (8-2) is used.

Moreover, what is necessary is to store only $p_{0,1}$ when Equation (9-1) or Equation (9-2) is used. At this time, what is necessary is just to store $p_{0,1}$ by the number of columns of the quasi-cyclic matrix $H_{QC}$, and it can be achieved by a small memory capacity even when $H_{QC}$ has a large number of rows. In addition to that, since a column index of the first row of the permutation matrix of j-th row is decided by integral multiples of $p_{0,1}$ based on these regularities, specifically, what is necessary is just to add $p_{0,1}$ for every row, it can be achieved by a small calculation amount.

It is noted that since a range of the combination to be taken in using Equation (8-1) or Equation (8-2) in which nothing is required to be stored becomes wider than that in using Equation (9-1) or Equation (9-2) is used, a combination with excellent performance can be chosen. Incidentally, the search method of $p_{0,1}$ will be below described.

Subsequently, mask processing for the parity check matrix $H_{QCL}$, which is distinctive processing in the check-matrix generating method of the present embodiment will be explained.

For example, when the left-hand side matrix shown in Equation (4-1) is represented by the quasi-cyclic matrix $H_{QC}$ of J×L as shown in following Equation (10-1), and a mask matrix $Z (=[z_{j,l}])$ is defined as a matrix with J-row×L-column on GF(2), the matrix $H_{MQC}$ after the mask processing can be represented as following Equation (10-2) if a predetermined rule described below is applied.

[Numerical Expression 5-1]

$$H_{QC} := \begin{bmatrix} I(p_{0,0}) & I(p_{0,1}) & \cdots & I(p_{0,L-1}) \\ I(p_{1,0}) & I(p_{1,1}) & \cdots & I(p_{1,L-1}) \\ \vdots & \vdots & \ddots & \vdots \\ I(p_{J-1,0}) & I(p_{J-1,1}) & \cdots & I(p_{J-1,L-1}) \end{bmatrix} \quad (10\text{-}1)$$

-continued

[Numerical Expression 5-2]

$$H_{MQC} = Z \otimes H_{QC} = \begin{bmatrix} z_{0,0}I(p_{0,0}) & z_{0,1}I(p_{0,1}) & \cdots & z_{0,L-1}I(p_{0,L-1}) \\ z_{1,0}I(p_{1,0}) & z_{1,1}I(p_{1,1}) & \cdots & z_{1,L-1}I(p_{1,L-1}) \\ \vdots & \vdots & \ddots & \vdots \\ z_{J-1,0}I(p_{J-1,0}) & z_{J-1,1}I(p_{J-1,1}) & \cdots & z_{J-1,L-1}I(p_{J-1,L-1}) \end{bmatrix} \quad (10\text{-}2)$$

Here, $z_{j,l}I(p_{j,l})$ in Equation (10-2) is defined as following Equation (11).

[Numerical Expression 6]

$$z_{j,1}I(p_{j,1}) = \begin{cases} I(p_{j,1}) & \text{for } z_{j,1} = 1 \\ \text{Zero-matrix} & \text{for } z_{j,1} = 0 \end{cases} \quad (11)$$

The zero-matrix is a zero-matrix with p-row×p-column. Additionally, the matrix $H_{MQC}$ is a matrix in which the quasi-cyclic matrix $H_{QC}$ is masked with 0-elements of the mask matrix Z, and the weight distribution is nonuniform (irregular), while a distribution of the cyclic permutation matrices of the matrix $H_{MQC}$ is the same as a degree distribution of the mask matrix Z.

Note that a weight distribution of the mask matrix Z when the weight distribution is nonuniform shall be determined by a predetermined density evolution method as will be below described. For example, the mask matrix with 64-row×32-column can be represented as following Equation (12) based on a column degree distribution by the density evolution method.

[Numerical Expression 7]

$$Z = \begin{bmatrix} Z^A \\ Z^A(1:32, 2:5)Z^A(1:32, 1)Z^A(1:32, 7:16)0_{32\times 17} \end{bmatrix} \quad (12)$$

Hence, the irregular parity check matrix $H_M$ to be finally determined in the present embodiment can be represented as following Equation (13) using, for example, the mask matrix Z with 64-row×32-column, the quasi-cyclic matrix $H_{QC}$ with 64 (row index j is 0 to 63)×32 (column index l is 0 to 31), and $H_T$ of 64 (row index j is 0 to 63)×64 (column index l is 0 to 31).

$$H_M = [Z \times H_{QC} \mid H_T] \quad (13)$$
$$= [H_{MQC} \mid H_T]$$

Namely, the parity check matrix $H_{MQC}$ for generating the LDPC codes C is given by a design of the mask matrix Z and a value of the cyclic permutation matrix at the row index j=0 of the quasi-cyclic matrix $H_{QC}$.

Subsequently, an implementation example when the encoding is achieved using the regular parity check matrix $H_M$ without using the generator matrix G will be shown hereinafter, and an operation thereof will be explained. Note herein that, the parity check matrix $H_{QCL}$ of the QC-LDPC codes with the LDGM structure is considered as a matrix shown in following Equation (14-1).

[Numerical Expression 8-1]

$$H_{QCL} = \begin{bmatrix} I(0) & I(0) & I(0) & 0 & 0 \\ I(1) & I(2) & I(0) & I(0) & 0 \\ I(2) & I(4) & 0 & I(0) & I(0) \end{bmatrix}, p = 5 \quad (14\text{-}1)$$

Meanwhile, the irregular parity check matrix $H_M$ in which the matrix shown in Equation (14-1) is masked is defined as a matrix shown in following Equation (14-2).

[Numerical Expression 8-2]

$$H_M = \begin{bmatrix} I(0) & I(0) & I(0) & 0 & 0 \\ I(1) & 0 & I(0) & I(0) & 0 \\ 0 & I(4) & 0 & I(0) & I(0) \end{bmatrix} \quad (14\text{-}2)$$

Additionally, the information message is defined as u=($u_{p,1}$ $u_{p,2}$)=(01100 11001). Note that $u_{p,1}$ is provided by dividing u for every p bits to then give numbers in an ascending order to 1.

Here, as processing in generating codes without using the generator matrix G, a product-sum operation of the matrix $H_{MQC}$ after the mask processing for p rows and the information message u will be explained.

Figures 1, 2:
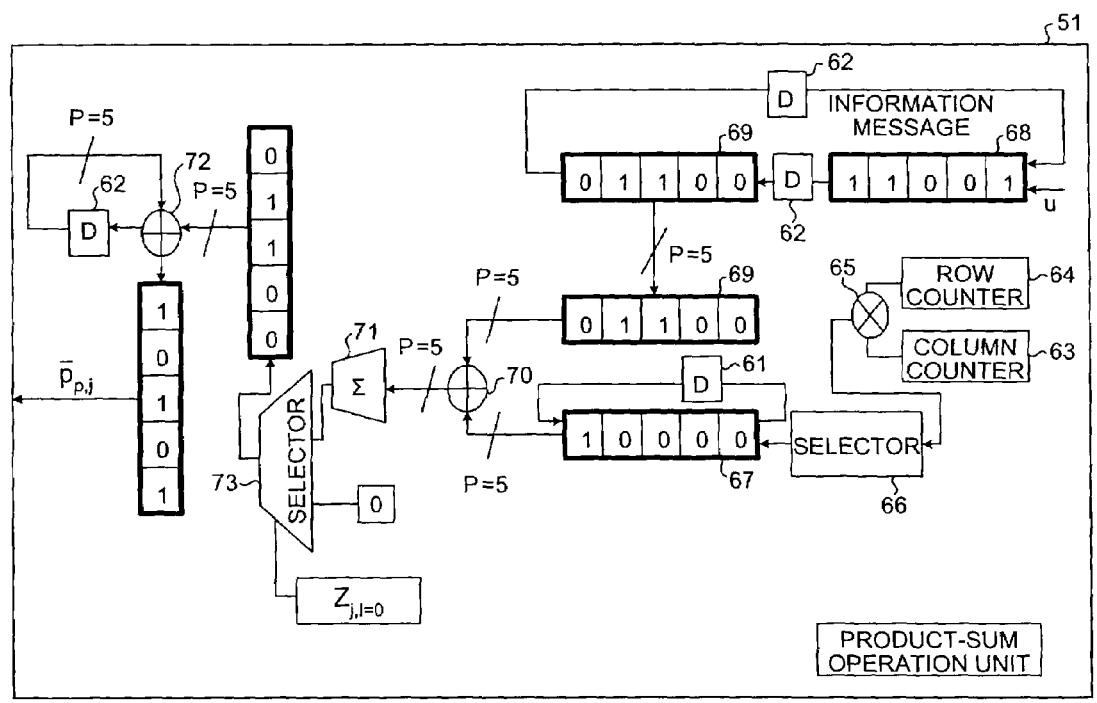
Figure 2:
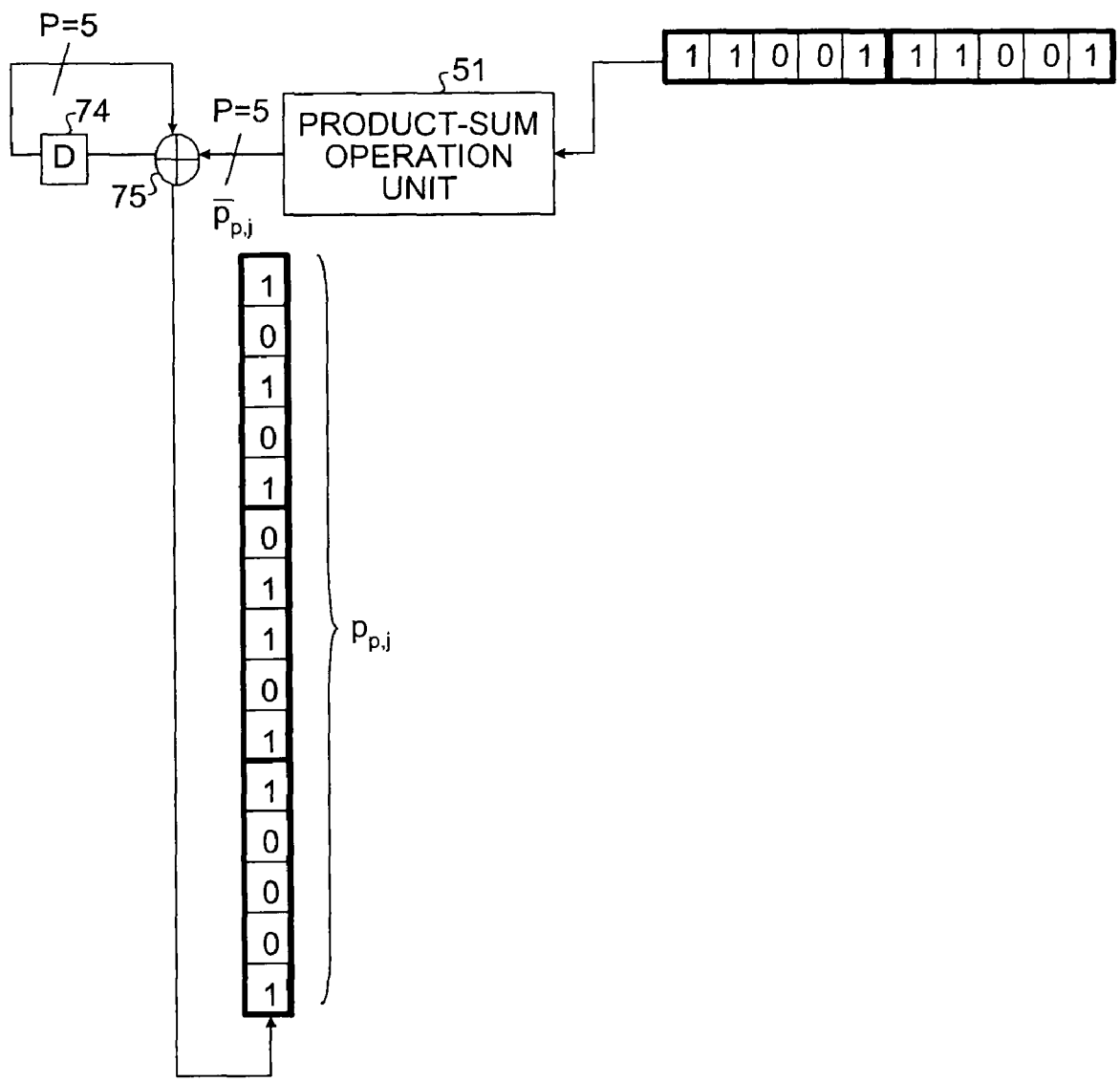

FIG. 2-1 is a view showing a configuration of a product-sum operation unit 51 in code generation. Here, a reference clock is set to 1 clock, and in the figure, a delay element (D) 61 operates per 1 clock cycle, a delay element (D) 62 operates per p clock cycles (in this example, P=5). Additionally, a column counter 63 operates per p clock cycles, and a row counter 64 operates per L·p clock cycles (in this example, L=2).

Since the cyclic permutation matrix at the j-th row and l-th column of the quasi-cyclic matrix $H_{QC}$ is I(j·(l+1)), "0≦j≦J−1", "0≦l≦L−1" in FIG. 2-1, j is counted per L·p clock cycles in an ascending order by the row counter 64, "l+1" is counted per p clock cycles in an ascending order by the column counter 63, "j·(l+1)" is calculated by a multiplier 65, the calculated value is inputted into a selector 66, and a position of "1" of a register 67 with length p is decided, so that a position of "1" of the first row of the cyclic permutation matrix at the j-th row and l-th column is set.

Meanwhile, as for the information message u, it is divided for every p-length to be then inputted into registers 68 and 69 in order via the delay element 62 per p clock cycles. EXOR between the information message u with length p in the register 69, and a bit string in the register 67 is then calculated by the adder 70, and a summation of each bit of EXOR operation results is calculated by an adder 72. A sum-product calculation between the first row of I(j·(l+1)) and $u_{p,1}$ of the information message can be achieved by this processing. Next, the second row of I(j−(l+1)) can be generated by shifting the register 67 using the delay element 61, thus a sum-product calculation between the second row of I(j·(l+1)) and $u_{p,1}$ of the information message can be similarly achieved. Thereafter, sum-product calculation results $p_{p,j}'$ for p rows of I(j·(l+1)) can be obtained by repeatedly executing this processing p times. Incidentally, $p_{p,j}'$ means p bits of the sum-product calculation results of all the cyclic permutation matrices at the j-th row.

Next, to calculate the product-sum between I(j·(l+1)) and $u_{p,1}$ from l=0 to l=L−1, the EXOR operation is repeatedly performed L times by the delay element 62 and the adder 72. This operation is repeatedly executed from j=0 to j=J−1, so that a sum-product calculation result $p_{p,j}'$ between the matrix $H_{MQC}$ after the mask processing and u is obtained. Incidentally, in the selector 73, 0 is selectively outputted when $z_{j,l}=0$, and an output of an adder 71 is selectively outputted when $z_{j,l}=1$.

Meanwhile, FIG. 2-2 is a view showing a configuration example of a code generating unit using the product-sum operation unit 51 shown in FIG. 2-1. Here, a delay element (D) 74 operates per L·p clock cycles. In FIG. 2-2, supposing that a sequence (parity bits) in which a number is given to j for every p bits in an ascending order is $p_{p,j}$, the sequence $p_{p,j}$ is obtained by the EXOR operation by the delay element 74 and an adder 75. Namely, "$p_{p,j}'=p_{p,j}' \cdot p_{p,j-1}'$" are calculated. Where, $p_{p,0}'=0$.

Subsequently, the masking rule when the quasi-cyclic matrix $H_{QC}$ is masked with the 0-elements of the mask matrix Z will be specifically explained. Here, the communication apparatus of the present embodiment generates the mask matrix Z for making the quasi-cyclic matrix $H_{QC}$ with 64 (row index j is 0 to 63)×32 (column index l is 0 to 31) non-uniform (irregular) based on the regular masking rule. As one example, the mask matrix Z corresponding to the codes of the encoding rate ⅓ is generated.

Figures 1, 16:
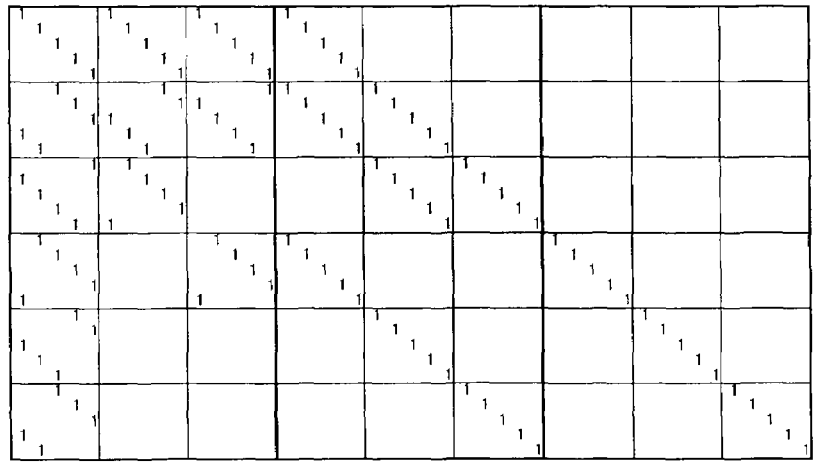
Figures 2, 16:
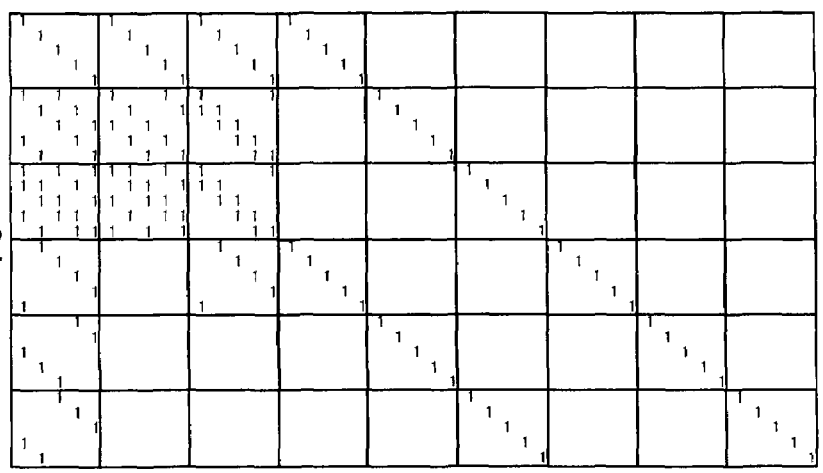
Figures 3, 16:
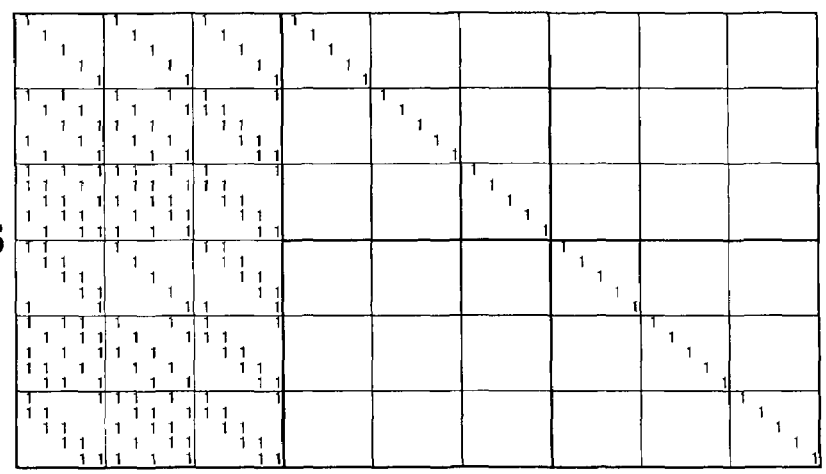

FIG. 3 is a flow chart showing mask-matrix generation processing according to the present embodiment. Note herein that an example when the mask-matrix generation processing is performed by the LDPC encoder unit 1 in the communication apparatus is shown in the present embodiment. Additionally, it is assumed that the irregular parity check matrix $H_{M(1/2)}$ corresponding to the codes of the encoding rate ½ is "$H_{M(1/2)}=[Z^A \times H_{QCU}|H_D]$". Note that $H_{QCU}$ represents the quasi-cyclic matrix of 32 (row index j is 0 to 31)×32 (column index l is 0 to 31) of the upper half in the quasi-cyclic matrix $H_{QC}$, and $H_D$ is, for example, a matrix of 32 (row index j is 0 to 31)×32 (column index l is 0 to 31) shown in Equation (5-2).

First, a size of the mask matrix is set to a multiple of 8 by the LDPC encoder 1 in the communication apparatus (Step S1). Here, as one example, the mask matrix Z corresponding to the codes of the encoding rate ⅓ is set to a matrix with 64-row×32-column, and the mask matrix $Z^A$ corresponding to the codes of the encoding rate ½ is set to a matrix with 32-row×32-column. For example, since a size of data used for communication is generally multiples of 8, it is possible to take consistency with the information length that is a multiple of 8, by setting the size of the mask matrix to a multiple of 8 even when a size of p is changed.

Figures 4, 5, 6:
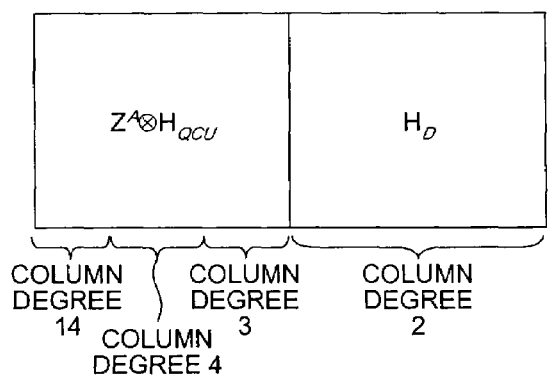
FIG. 4 is a view showing an example of a column degree distribution of a parity check matrix $H_{M(1/2)}$.
FIG. 5 is a view showing an example of a column degree distribution of a parity check matrix $H_{M(1/3)}$.
FIG. 6 is a view showing a configuration example of an irregular parity check matrix $H_{M(1/2)}$ after being masked by a mask matrix $Z^A$.

Next, the LDPC encoder 1 calculates a column degree distribution of the mask matrix $Z^A$ by the density evolution method using the number of rows of the mask matrix $Z^A$ as the maximum degree, and a degree distribution of $H_D$ shown in Equation (5-2) as constraints (Step S2). FIG. 4 is a view showing an example of a column degree distribution of the parity check matrix $H_{M(1/2)}$ (=$[Z^A \times H_{QCU}|H_D]$), wherein numeric characters (fractional number) described in fields of column degrees 14, 4, and 3 represent column degree distributions of the mask matrix $Z^A$, respectively. Incidentally, a field of a column degree 2 corresponds to a column degree distribution of $H_D$.

Further, the LDPC encoder 1 calculates a column degree distribution of the mask matrix Z by the density evolution method using the number of rows of the mask matrix Z as the maximum degree, and a degree distribution of $H_T$ of 64 (row index j is 0 to 63)×64 (column index l is 0 to 63) shown in Equation (5-1) and the column degree distribution of the mask matrix $Z^A$ calculated above as constraints (Step S2). FIG. 5 is a view showing an example of a column degree distribution of the irregular parity check matrix $H_{M(1/3)}$ (=$[Z \times H_{QC}|H_T]$) corresponding to the codes of the encoding rate ⅓, wherein numeric characters described in fields of column degrees 28, 8, 4, and 3 (for nine columns) represent the column degree distribution of the mask matrix Z, respectively. Incidentally, (41−9)/96 of the column degree 3, and a field of a column degree 1 correspond to the column degree distribution of $H_T$.

Next, the LDPC encoder 1 decides a position of "1" of a column with a large column degree in the mask matrix $Z^A$, namely, a column (5/64) of a column degree 14, here, based on the column degree distribution of the mask matrix $Z^A$, so as to satisfy following conditions of priority #1 (Step S3). For example, when there are successive "1s" in Z, there are cyclic permutation matrices in four positions between vertically successive I(0) of the $H_D$, and they may compose a loop 4, thus the possibility is eliminated by satisfying the following conditions of priority #1.

Conditions of priority #1: an interval between "1s" in the same column is separated by two or more rows.

At this time, since the column with the large column degree has a large density of "1", it does not need to satisfy conditions of priority #2 described below. Additionally, to achieve the column degree 14 that is determined above, "1" may continue in the same column, but the number thereof shall be reduced as much as possible.

There is only one column with the large column degree of 14 here, but when there are a plurality of columns with large column degrees, such as 14, 13, 12, . . . , for example, the columns of the mask matrix $Z^A$ are arranged in a descending order of the column degree from the left (Step S3).

Next, the LDPC encoder 1 decides a position of "1" of columns with small column degrees in the mask matrix $Z^A$, namely, columns (18/64, 9/64) with column degrees 4 and 3 here, based on the column degree distribution of the mask matrix $Z^A$, so as to satisfy the conditions of priority #1, and the following conditions of priority #2, (Step S4). For example, when an arrangement of "1" of the mask matrix is also regular to a combination of the cyclic permutation matrices based on a regular rule, there may be many identical loops in multiplex because of its regularity, if there is an arrangement of "1" of the mask matrix that composes a specific loop. However, the occurrence probability can be reduced by satisfying the following conditions of priority #2.

Conditions of priority #2: arrange "1" based on random numbers.

The columns of the mask matrix $Z^A$ are then arranged in a descending order of the column degree from the left following the column with the large column degree (Step S4).

For example, the mask matrix $Z^A$ generated at Steps S3 and S4 will result in a matrix shown in Equation (15).

[Numerical Expression 9]

$$Z^A = \begin{bmatrix} 1&0&0&1&0&0&0&0&0&0&1&0&0&0&0&1&0&0&0&0&0&0&0&0&0&1&0&0&0&0&0&0 \\ 0&1&0&0&1&0&0&1&0&0&0&0&0&0&0&0&0&0&0&0&0&1&0&0&0&0&0&0&0&1&0&0 \\ 1&0&1&0&0&1&0&0&0&0&0&0&1&0&0&0&0&1&0&0&0&0&0&0&0&0&0&0&0&0&1&0 \\ 1&0&0&1&0&0&1&0&0&0&0&0&0&0&0&0&1&0&0&0&0&0&1&0&1&0&0&0&0&0&0 \\ 0&1&0&1&1&0&0&0&0&0&1&0&0&0&0&0&0&0&0&1&0&0&0&0&1&0&0&0&0&0&0&0 \\ 0&0&1&0&1&0&0&0&0&0&1&0&0&0&0&0&0&1&0&0&0&0&1&0&0&0&0&0&0&0&0&0 \\ 1&0&0&0&1&0&0&0&0&0&0&0&1&0&0&0&1&0&0&1&0&0&0&0&0&0&0&0&1&0&0&0 \\ 1&1&0&0&0&0&0&0&0&0&0&0&0&0&0&0&0&0&0&0&0&0&0&0&0&1&0&0&1&0&0 \\ 0&0&1&1&0&0&0&0&1&0&0&0&0&0&0&1&0&0&0&0&0&0&0&1&0&0&0&0&0&0&0 \\ 1&0&1&1&1&0&0&0&0&0&0&1&0&0&0&0&1&1&0&0&0&0&0&0&0&0&0&0&0&0&1&0 \\ 1&1&0&0&0&0&1&0&0&0&0&0&0&1&0&0&0&0&0&0&0&0&0&0&0&0&0&0&1&0&0&0 \\ 0&0&1&1&0&0&0&0&0&0&0&1&0&0&0&0&0&0&1&1&0&0&0&0&0&0&0&0&0&0&0&0 \\ 1&0&0&1&0&0&0&0&1&0&0&0&0&0&0&0&1&0&0&0&1&0&0&0&1&0&0&0&0&0&0&0 \\ 0&1&0&1&0&0&1&0&0&0&0&0&0&0&0&0&0&0&0&0&0&0&0&0&0&0&0&1&0&0&0&0 \\ 0&0&1&1&1&0&0&0&0&0&0&0&1&0&1&0&0&0&0&0&0&0&0&0&0&0&0&0&0&0&0&0 \\ 1&0&1&0&0&1&0&1&0&0&0&0&0&0&0&0&0&0&0&0&1&0&0&0&0&1&0&0&0&0&0&0 \\ 0&1&0&1&0&0&0&0&0&1&0&0&1&0&0&0&0&0&0&0&0&0&1&0&0&0&0&0&0&0&0&1 \\ 0&0&1&1&0&0&0&0&0&0&0&0&0&1&0&0&0&0&0&0&1&0&0&0&0&0&1&0&0&0&0&0 \\ 1&0&0&0&1&1&0&0&0&0&1&0&0&0&0&0&0&0&1&0&0&0&0&0&0&0&0&1&0&0&0&0 \\ 0&1&0&1&0&0&0&0&0&1&0&0&0&0&0&1&0&0&0&0&0&0&0&0&0&0&0&0&0&0&1&0 \\ 0&1&1&0&0&0&0&0&0&0&0&0&1&0&0&0&0&0&0&0&1&0&0&0&1&0&0&0&0&0&0 \\ 1&0&0&1&0&0&0&0&0&0&0&0&1&0&0&0&0&1&0&0&0&0&0&0&0&0&0&1&0&0&0 \\ 0&1&0&0&1&0&0&0&0&0&0&0&0&0&0&0&0&1&0&0&0&0&0&0&0&0&0&0&0&0&0 \\ 0&0&1&1&1&0&0&0&0&0&0&0&0&0&0&0&0&0&0&0&1&0&0&1&0&0&0&0&0&0&0 \\ 1&0&0&0&0&0&0&0&1&1&0&1&0&0&0&0&0&0&0&0&0&0&0&0&1&0&0&0&0&0&0 \\ 0&1&0&1&0&0&0&1&0&0&1&0&0&0&0&0&0&0&1&0&0&0&0&0&0&0&0&0&0&0&0 \\ 0&0&1&0&1&0&0&0&0&0&0&0&0&1&0&1&0&0&0&0&0&0&0&0&0&0&0&0&0&0&0&1 \\ 1&0&0&1&0&0&0&0&0&0&1&0&0&0&0&0&0&0&0&1&0&0&0&0&0&0&1&0 \\ 0&1&0&1&0&0&1&0&0&0&0&0&0&0&0&1&0&0&0&0&0&0&0&0&1&0&0&0&1&0&0 \\ 0&0&1&0&0&0&0&0&1&0&0&0&0&0&0&0&0&0&0&1&0&0&0&0&0&0&0&0&0 \\ 1&1&0&0&1&0&0&1&1&0&0&0&1&0&0&0&0&0&0&0&0&0&0&0&0&1&0&0&0&0&0 \\ 0&1&0&0&1&1&0&0&0&0&1&0&0&0&0&0&0&0&1&0&0&0&0&1&0&0&0&0&0&0&1 \end{bmatrix}$$

(15)

It should be noted that in composing the mask matrix $Z^A$ based on the column degree distribution of the mask matrix $Z^A$ that is determined by the density evolution method, if small loops (loop 4, 6, or the like) are included in a column with the small column degree (column degree 3, 4, or the like), error probability is increased, and thus excellent performance may not be obtained. In such a case, the LDPC encoder 1 avoids performance degradation by increasing the weight of the column with the small column degree. In the case of the mask matrix $Z^A$, the weights of three columns of the columns (9/64) with column degree 3 are increased in the column degree distribution shown in FIG. 4, Namely, there are 5 columns with column degree 14, 21 columns with column degree 4, and 6 columns with column degree 3 in Equation (15).

Next, the LDPC encoder 1 decides a position of "1" of a column with the large column degree in the mask matrix Z, namely, a column (5/96) with column degree 28 here, based on the column degree distribution of the mask matrix Z, so as to satisfy the conditions of priority #1 (Step S5). At this time, since the column with the large column degree has a large density of "1", it does not need to satisfy the conditions of priority #2. Additionally, to achieve the column degree 28 determined above, "1" may continue in the same column, but the number thereof shall be reduced as much as possible.

There is only one column with the large column degree of 28 here, but when there are a plurality of columns with the large column degree, the columns of the mask matrix Z are arranged in a descending order of the column degree from the left (Step S5).

Next, the LDPC encoder 1 decides a position of "1" of columns with the small column degrees in the mask matrix Z, namely, some columns (10/96, 8/96, 9/96) of the column degrees 8, 4, and 3 here, based on the column degree distribution of the mask matrix Z, so as to satisfy the conditions of priority #1, and the conditions of priority #2 (Step S6).

The columns of the mask matrix Z are then arranged in a descending order of the column degree from the left following the column with the large column degree (Step S6).

For example, the mask matrix Z generated at Steps S5 and S6 can be represented as Equation (12). In Equation (12), $Z^A(1:32,2:5)$ represents submatrices in the first row to 32nd row, and the second column to the fifth column of the mask matrix $Z^A$, $Z^A(1:32,1)$ represents submatrices in the 1st row to 32nd row, and the 1st column of the mask matrix $Z^A$, and $Z^A(1:32,7:16)$ represents submatrices in the first row to 32nd row, and the seventh column to the sixteenth column of the mask matrix $Z^A$.

Incidentally, in composing the mask matrix Z based on the column degree distribution of the mask matrix Z that is determined by the density evolution method, if a small loop (loop 4, 6, or the like) is included in the column with the small column degree (column degree 3, 4, 8, or the like), error probability is increased, and thus excellent performance may not be obtained. In such a case, the LDPC encoder 1 avoids performance degradation by increasing the weight of the column with the small column degree.

Meanwhile, in applying the LDPC codes to applications of unequal error probability such as multi-level modulation, if a bit with small error probability is allocated to a bit corresponding to the column with the large column degree, and a bit with large error probability is allocated to a bit corresponding to the column with the small column degree, performance is improved. In such a case, when the columns are arranged from the left-hand side in a descending order of the column degree as shown at Steps S3 to S6, ordering of the bits becomes easy.

Figure 7:
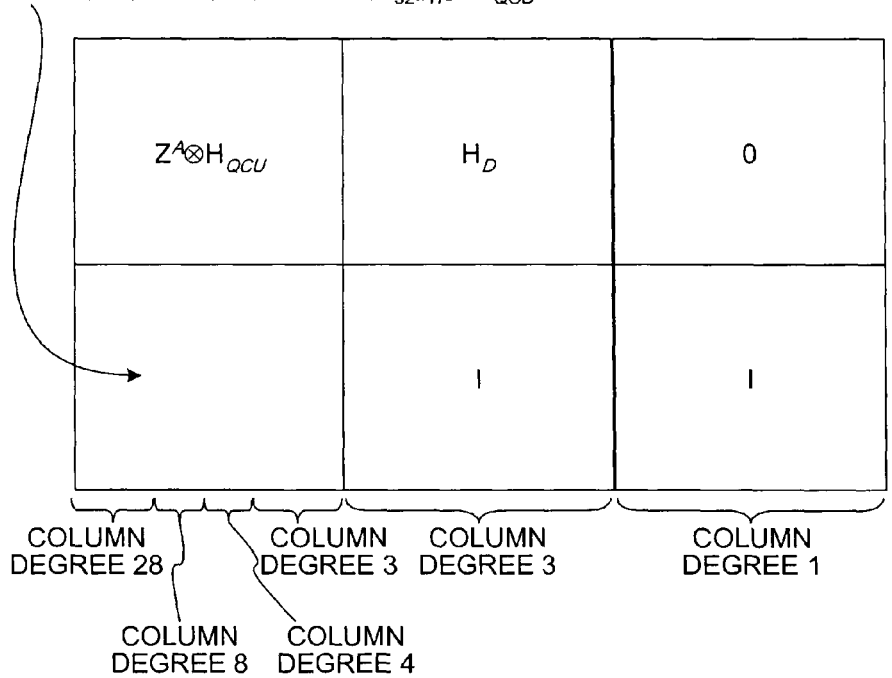
FIG. 7 is a view showing a configuration example of an irregular parity check matrix $H_{M(1/3)}$ after being masked by a mask matrix Z.

FIG. 6 is a view showing a configuration example of the irregular parity check matrix $H_{M(1/2)}$ after being masked by the mask matrix $Z^A$ generated as mentioned above, while FIG. 7 is a view showing a configuration example of the irregular parity check matrix $H_{M(1/3)}$ after being masked by the mask matrix Z generated as mentioned above. Incidentally, in FIG. 7, $H_{QCD}$ shown in the figure represents the quasi-cyclic matrix of 32 (row index j is 32 to 63)×32 (column index l is 0 to 31) of the lower half in the quasi-cyclic matrix $H_{QC}$. In addition, 0 in the figure represents a zero-matrix, and I in the figure represents a unit matrix, wherein $H_T$ is composed of $H_D$, I, and 0.

Subsequently, a mask matrix designing method using a pseudo-random number sequence will be explained. For example, in the explanation, the position of "1" in the column with the small column degree is decided so as to satisfy the conditions of priority #1 and conditions of priority #2. Specifically, in the present embodiment, the position of "1" in the column with the small column degree is decided using the pseudo-random number sequence in which a difference between the positions of 1" in the same column is two or more.

For example, random numbers are generated based on Fermat's little theorem shown in following Equation (16) in the present embodiment. Incidentally, $G_0$ is a primitive element of GF(p).

$$A(i)=G_0^i \bmod p, i=0,1,2,\ldots,p-2 \quad (16)$$

If there are any elements whose difference is 1 in the random number sequence, processing in which a back element is moved to the last is performed, for example, to thereby decide a position of "1" in the column with the small column degree using a random number sequence after performing this processing.

Specifically, when the random number sequence is generated as P=11 and $G_0$=2,

{1 2 4 8 5 10 9 7 3 6} is obtained, so that respective back elements 2 and 9 of an element 1 and an element 2, and an element 10 and an element 9, in which the difference between the elements is 1 are moved to the end. Namely,

{1 4 8 5 10 7 3 6 2 9} is obtained.

Thereafter, the random number sequence after the rearrangement is divided for every column degree to make it as a row position number. For example, supposing that the column degree 3 is 2 columns, and the column degree 4 is 1 column, the random number sequence is divided as {1 4 8}, {5 10 7}, {3 6 2 9}, and each element after the division is a row index of "1" in the column.

When the positioning of "1" is then completed according to this random number sequence, a random number sequence is further generated in a different primitive element similarly to thereby decide a position of "1" of the remaining columns using its random number sequence.

An effect that the small loops are hardly generated is provided by this processing. Moreover, although there is a possibility that the short loop may be generated when $H_T$ is used and "1s" adjoin to each other in the same column of the mask matrix, the possibility can be avoided by using the random number sequence.

Note herein that the method of generating the random number sequence is one example, and any types of sequence may be used as long as it is a pseudo-random number sequence in which the difference between the elements in the same column is two or more.

Subsequently, the search method of $p_{0,1}$ will be explained. The search method of $p_{0,1}$ by the communication apparatus according to the present embodiment when the mask matrix $Z^A$ is used and the quasi-cyclic matrix $H_{QC}$ based on Equation (9-1) or Equation (9-2) is used will be explained here. Additionally, it is assumed that $H_{M(1/2)}$ is "$H_{M(1/2)}=[Z^A \times H_{QCU}|H_D]$" using the mask matrix $Z^A$ determined in FIG. 3.

Figure 8:
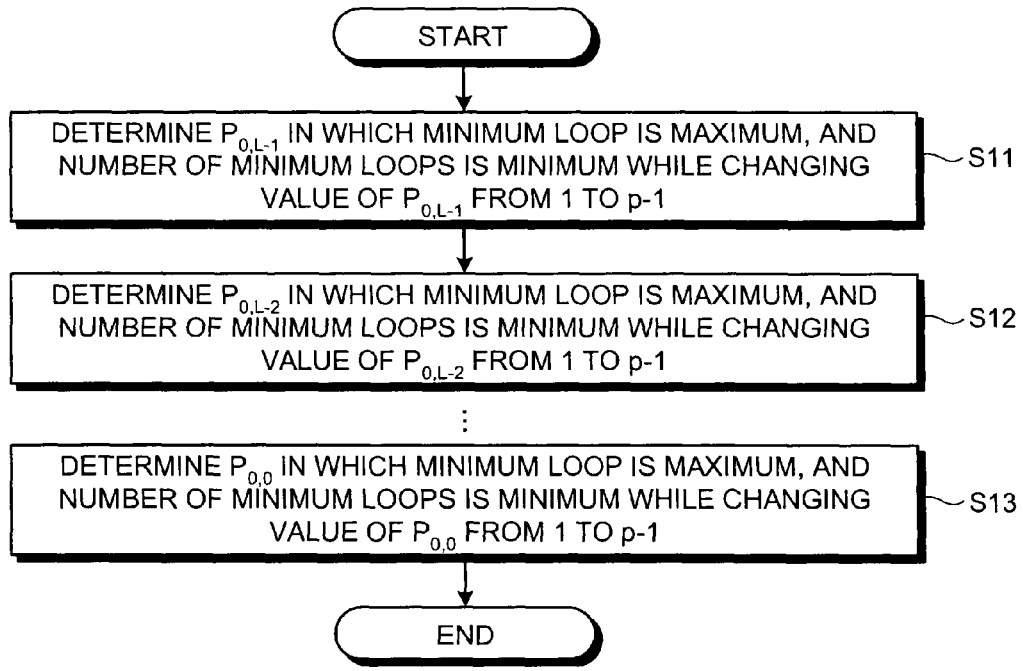
FIG. 8 is a flow chart showing a search method of $p_{0,1}$.

FIG. 8 is a flow chart showing the search method of $p_{0,1}$ according to the present embodiment. First, the LDPC encoder 1 changes a value of $p_{0,L-1}$ from 1 to p−1 based on "$H_{M(1/2)}=[Z^A \times H_{QCU}|H_D]$" to thereby determine $p_{0,L-1}$ in which the minimum loop is the maximum and the number of the minimum loops is the minimum (Step S11). At this time, it is a condition that all the cyclic permutation matrices from the first column to the (L−2)-th column of $H_{M(1/2)}$ are replaced to the zero-matrices.

Next, the LDPC encoder 1 changes a value of $p_{0,L-2}$ from 1 to p−1 based on "$H_{M(1/2)}=[Z^A \times H_{QCU}|H_D]$" to thereby determine $p_{0,L-2}$ in which the minimum loop is the maximum and the number of the minimum loops is the minimum (Step S12). At this time, it is a condition that all the cyclic permutation matrices from the first column to the (L−3)-th column of $H_{M(1/2)}$ are replaced to the zero-matrices.

Hereafter, the LDPC encoder 1 continues to determine $p_{0,L-3}$, $p_{0,L-4}$, $p_{0,L-5}$ by the processing similar to that described above, and lastly, changes a value of $p_{0,0}$ from 1 to p−1 based on "$H_{M(1/2)}=[Z^A \times H_{QCU}|H_D]$" to thereby determine $p_{0,0}$ in which the minimum loop is the maximum and the number of the minimum loops is the minimum (Step S13).

Since $p_{0,1}$ is preferentially decided by performing the processing of Steps S11 to S13 from the column with the small column degree that is easy to be influenced by the minimum loop, the check matrix with excellent performance can be designed.

Here, one example of $p_{0,1}$ determined by the search method will be shown hereinafter. For example, when Equation (9-2) is applied to $H_{QC}$ of 32 (row index j is 0 to 31)×32 (column index l is 0 to 31), $p_{0,0}$=39, $p_{0,0}$=21, $p_{0,2}$=41, $p_{0,3}$=61, $p_{0,4}$=6, $p_{0,5}$=40, $p_{0,6}$=1, $p_{0,7}$=37, $p_{0,8}$=3, $p_{0,9}$=34, $p_{0,10}$=26, $p_{0,11}$=10, $p_{0,12}$=22, $p_{0,13}$=16, $p_{0,14}$=37, $p_{0,15}$=17, $p_{0,16}$=25, $p_{0,17}$=23, $p_{0,18}$=12, $p_{0,19}$=1, $p_{0,20}$=10, $p_{0,21}$=14, $p_{0,22}$=6, $p_{0,23}$=24, $p_{0,24}$=25, $p_{0,25}$=26, $p_{0,26}$=27, $p_{0,27}$=28, $p_{0,28}$=29, $p_{0,29}$=30, $p_{0,30}$=31, $p_{0,31}$=3 2 is obtained.

Note herein that in the present embodiment, the mask matrix design method using the pseudo-random number sequence and the search method of $p_{0,1}$ are easily applicable even when neither $H_D$ nor $H_T$ is included in the parity check matrix.

As is understood, in the present embodiment, specific regularity that the column index of the first row of the cyclic permutation matrix arranged at the row index j and the column index l of the $H_{QC}$ portion in the quasi-cyclic matrix becomes Equation (8-1), Equation (8-2), Equation (9-1), and Equation (9-2) is provided to the parity check matrix $H_{QCL}$ of the QC-LDPC codes with the LDGM structure, and the quasi-cyclic matrix $H_{QC}$ to which the specific regularity is provided is masked using the mask matrix generated by the predetermined method, so that the irregular parity check matrix is generated. As a result of this, the irregular parity check matrix $H_M$ with the LDGM structure can be generated from the parity check matrix $H_{QCL}$ with the LDGM structure. Moreover, encoding can be achieved easily without using the generator matrix G as a result of forming a part of the parity check matrix into the staircase structure, and thus allowing the circuit scale to be greatly reduced since it is not necessary to generate the generator matrix G.

Second Embodiment

While the code configuration method up to the encoding rate 1/3 is explained in the first embodiment, the code configuration method up to, for example, the encoding rate 1/10 will be explained in the present embodiment. Incidentally, a system configuration thereof is similar to that shown in FIG. 1 of the first embodiment. Here, the processing that is different from that in the first embodiment will be explained.

A masking rule when the quasi-cyclic matrix $H_{QC}$ of 288 (row index j is 0 to 287)×32 (column index l is 0 to 31) corresponding to the encoding rate 1/10 is masked with the O-elements of the mask matrix Z with 288-row×32-column will be specifically explained here. Here, the communication apparatus of the present embodiment generates the mask matrix Z for making the quasi-cyclic matrix $H_{QC}$ of 288×32 irregular based on the regular masking rule.

Hereinafter, the processing different from that shown in FIG. 3 of the first embodiment will be explained as the mask-matrix generation processing of the present embodiment. Note herein that after generating the mask matrix Z, the irregular parity check matrix $H_M$ to be finally determined can be represented as following Equation (17) using, for example, the mask matrix Z with 288-row×32-column, the quasi-cyclic matrix $H_{QC}$ of 288×32, and $H_T$ of 288 (row index j is 0 to 287)×288 (column index l is 0 to 287).

$$H_M = [Z \times H_{QC} | H_T] \quad (17)$$
$$= [H_{MQC} | H_T]$$

In addition, the $H_T$ is defined as following Equation (18), and $T_D$ in $H_T$ is further defined as following Equation (19).

[Numerical Expression 10]

$$H_T := \begin{bmatrix} T_D & 0 & 0 & 0 & 0 & 0 & 0 & 0 & 0 \\ I & I & 0 & 0 & 0 & 0 & 0 & 0 & 0 \\ 0 & I & I & 0 & 0 & 0 & 0 & 0 & 0 \\ 0 & 0 & I & I & 0 & 0 & 0 & 0 & 0 \\ 0 & 0 & 0 & I & I & 0 & 0 & 0 & 0 \\ 0 & 0 & 0 & 0 & I & I & 0 & 0 & 0 \\ 0 & 0 & 0 & 0 & 0 & I & I & 0 & 0 \\ 0 & 0 & 0 & 0 & 0 & 0 & I & I & 0 \\ 0 & 0 & 0 & 0 & 0 & 0 & 0 & I & I \end{bmatrix} \quad (18)$$

[Numerical Expression 11]

$$T_D := \begin{bmatrix} I(0) & 0 & 0 & \cdots & 0 \\ I(0) & I(0) & 0 & \cdots & 0 \\ 0 & I(0) & I(0) & \ddots & \vdots \\ \vdots & \ddots & \ddots & \ddots & \vdots \\ 0 & \cdots & 0 & I(0) & I(0) \end{bmatrix} \quad (19)$$

[Numerical Expression 12]

$$Z = \begin{bmatrix} Z^A \\ \hline Z^A(1:32, 2:5) Z^A(1:32, 1) Z^A(1:32, 7:16)\ 0_{32 \times 17} \\ \hline Z^A(1:32, 3:5) Z^A(1:32, 1:2) Z^A(1:32, 8:17)\ 0_{32 \times 17} \\ \hline Z^A(1:32, 4:5) Z^A(1:32, 1:3) Z^A(1:32, 9:18)\ 0_{32 \times 17} \\ \hline Z^A(1:32, 5) Z^A(1:32, 1:4) Z^A(1:32, 10:19)\ 0_{32 \times 17} \\ \hline Z^A(1:32, 1) Z^A(1:32, 2:5) Z^A(1:32, 11:20)\ 0_{32 \times 17} \\ \hline Z^A(1:32, 2:5) Z^A(1:32, 1) Z^A(1:32, 12:21)\ 0_{32 \times 17} \\ \hline Z^A(1:32, 3:5) Z^A(1:32, 1:2) Z^A(1:32, 13:22)\ 0_{32 \times 17} \\ \hline Z^A(1:32, 4:5) Z^A(1:32, 1:3) Z^A(1:32, 14:23)\ 0_{32 \times 17} \end{bmatrix} \quad (20)$$

Meanwhile, it is assumed that the irregular parity check matrix corresponding to the codes of the encoding rate ½ is "$H_{M(1/2)} = [Z^A \times H_{QC(1/2)} | H_{T(1/2)}]$". Note that $Z^A$ ($=Z^{A(1/2)}$) is the mask matrix with 32-row×32-column, $H_{QC(1/2)}$ represents the quasi-cyclic matrix of 32 (row index j is 0 to 31)×32 (column index l is 0 to 31) of ⅑ from the top in the quasi-cyclic matrix $H_{QC}$, and $H_{T(1/2)}$ is the $T_D$. Additionally, corresponding to the encoding rates ⅓, ¼, . . . , 1/10, the irregular parity check matrices are represented as $H_{M(1/3)}$, $H_{M(1/4)}$, . . . , $H_{M(1/10)}$ ($=H_M$), the mask matrices are represented as $Z^{A(1/3)}$, $Z^{A(1/4)}$, . . . , $Z^{A(1/10)}$ ($=Z$), the quasi-cyclic matrices are represented as $H_{QC(1/3)}$, $H_{QC(1/4)}$, . . . , $H_{QC(1/10)}$ ($=H_{QC}$), and are represented as $H_{T(1/3)}$, $H_{T(1/4)}$, . . . , $H_{T(1/10)}$ ($=H_T$), respectively.

For example, in the processing at Step S2 shown in FIG. 3, the LDPC encoder 1 of the present embodiment first calculates a column degree distribution of the mask matrix $Z^A$ corresponding to the encoding rate ½ by the density evolution method, using the number of rows of the mask matrix $Z^A$ as the maximum degree and the degree distribution of the $H_{T(1/2)}$ ($=T_D$) as constraints. Next, the LDPC encoder 1 calculates a column degree distribution of the mask matrix $Z^{A(1/3)}$ corresponding to the encoding rate ⅓ by the density evolution method using the degree distribution of the $H_{T(1/3)}$ and the column degree distribution of the mask matrix $Z^A$ determined above as constraints. Hereafter, column degree distributions of the mask matrix corresponding to the encoding rates ¼, ⅕, and . . . are sequentially calculated by the density evolution method, using the column degree distribution of the previous mask matrix as constraints, and lastly, a column degree distribution of the mask matrix Z is calculated by the density evolution method using the degree distribution of $H_T$ and the column degree distribution of the mask matrix $Z^{A(1/9)}$ corresponding to the encoding rate ⅑ as constraints. FIG. 9 is a view showing one example of the column degree distribution of the irregular parity check matrix $H_M=[Z \times H_{QC}|H_T]$ corresponding to the codes of the encoding rate 1/10.

Next, the LDPC encoder 1 decides a position of "1" of each column of the mask matrix corresponding to the encoding rates ½ and ⅓ based on the conditions of priority #1 and the conditions of priority #2 in manner similar to that of the first embodiment in the processing of Steps S3 to S6 in FIG. 3, and thereafter, further decides a position of "1" of each column of the mask matrix corresponding to the encoding rate ¼, ⅕, . . . , 1/10 in a similar procedure.

For example, the mask matrix Z generated by the processing of the present embodiment can be represented as following Equation (20).

Figure 10:
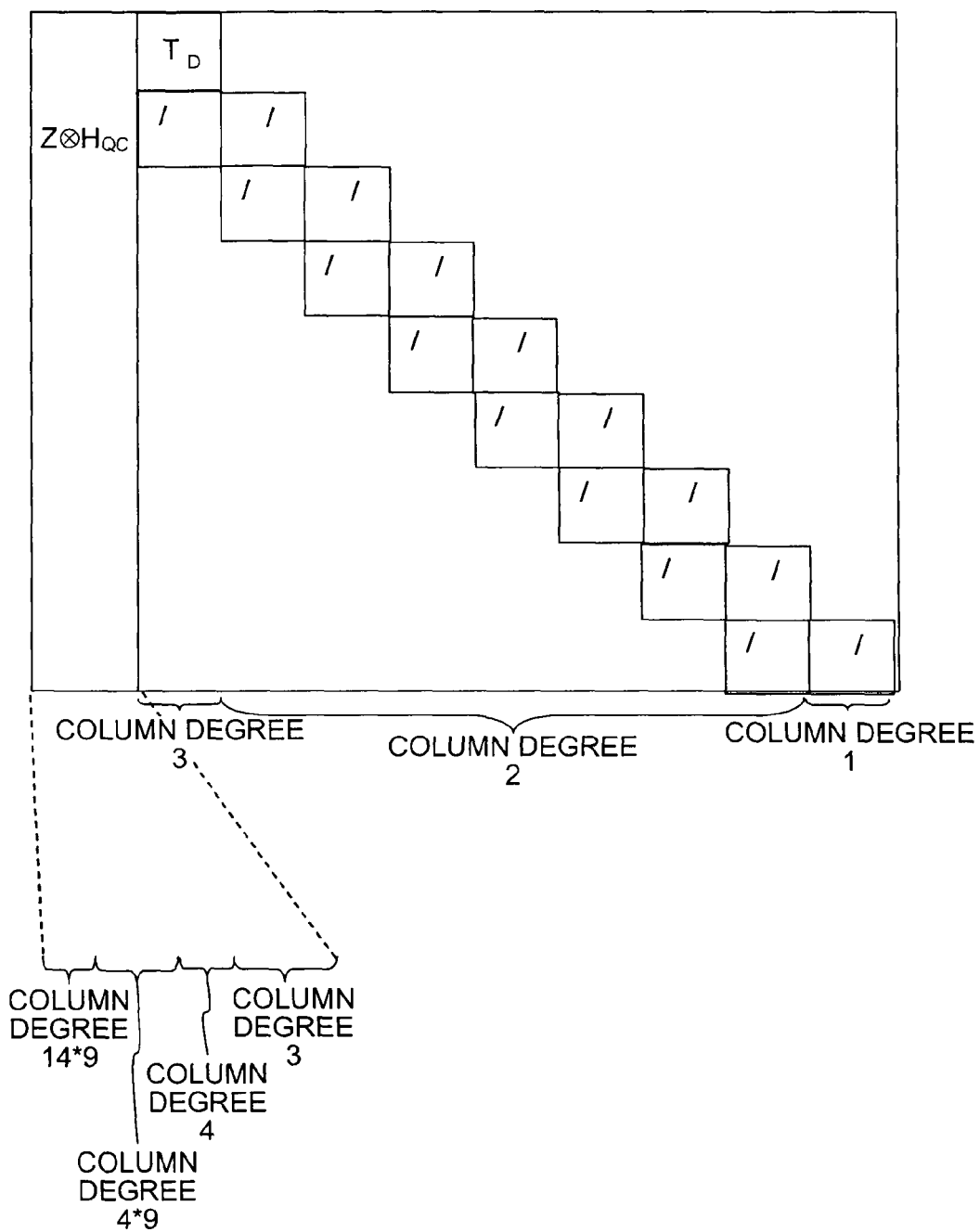
FIG. 10 is a view showing a configuration example of the irregular parity check matrix $H_M$ after being masked by the mask matrix Z.

FIG. 10 is a view showing a configuration example of the irregular parity check matrix $H_M$ after being masked by the mask matrix Z that is generated as described above.

As is understood, since the mask matrix Z is composed only using the submatrices of the mask matrix $Z^A$ corresponding to the encoding rate ½ in the present embodiment, the memory capacity for storing the mask matrix can be reduced even when the mask matrix becomes large according to the encoding rate.

Additionally, each mask matrix according to the encoding rate is used while shifting the submatrices of the mask matrix $Z^A$ so that the same pattern may not be formed in a column direction. Specifically, the submatrices of the mask matrix $Z^A$ are separated into submatrices with a heavy column degree (weight 14), and submatrices with light column degrees (weight is four or less), and are used while shifting each of them. For example, $Z^A(1:32,1:5)$ are the submatrices with the column degree 14 in the mask matrix $Z^A$, whereas in the mask matrix $Z^{A(1/3)}$, they are shifted to the left per column, and $Z^A(1:32,2:5)\ Z^A(1:32,1)$ after the shift are coupled under $Z^A(1:32,1:5)$ of the mask matrix $Z^A$. Meanwhile, $Z^A(1:32,6:32)$ are submatrices with four or less column degrees in the mask matrix $Z^A$, whereas in the mask matrix $Z^{A(1/3)}$, the submatrices $Z^A(1:32,7:16)$ with the required number of columns are used among $Z^A(1:32,6:32)$, and these $Z^A(1:32,7:16)$ are couple under $Z^A(1:32,6:15)$ of the mask matrix $Z^A$. The mask matrices $Z^{A(1/4)}$, $Z^{A(1/5)}$, and $Z^{A(1/6)}$ . . . are also used while shifting the submatrices of the mask matrix $Z^A$ so that the same pattern may not be formed in the column direction. As a result of this, small loops that are easy to be generated when $H_T$ is used can be avoided.

Third Embodiment

Subsequently, rules when the parity check matrix generated in the first and second embodiments deals with the arbitrary code length will be explained.

It is possible to deal with the arbitrary code length by changing the size p of the cyclic permutation matrix $I(p_{j,l})$, and in that case, a value of $p_{j,l}$ is changed base on following rules in the present embodiment.

(1) In "$p \leq p_A$", the value of $p_{j,l}$ is changed as shown in following Equation (21).

$$p_{j,l}^{len} = p_{j,l}^{PA} \bmod p \quad (21)$$

Note that $p_{j,l}^{len}$ is a column index of 1 of the first row of the cyclic permutation matrices at the time of the size p, and $p_{j,l}^{PA}$ is a column index of 1 of the first row of the cyclic permutation matrices at the time of a size $p_A$, where these $p_{j,l}^{PA}$ and $p_A$ shall be determined in advance.

(2) In "$p > p_A$", the value of $p_{j,l}$ is changed as shown in following Equation (22), following Equation (23), following Equation (24), or Equation (21).

[Numerical Expression 13]

$$p_{j,l}^{len} = \left\lfloor p_{j,l}^{PA} \times \left(\frac{p}{p_A}\right) \right\rfloor + \left\lfloor \frac{p}{p_A} \times \frac{j \times 1}{S_M} \times \alpha \right\rfloor \quad (22)$$

[Numerical Expression 14]

$$p_{j,l}^{len} = \left\lfloor p_{j,l}^{PA} \times \left(\frac{p}{p_A}\right) \right\rfloor \pm \left[\frac{p}{p_A} \times \text{arbitrary integer by less than } \alpha (\text{changed by } j, l)\right] \quad (23)$$

[Numerical Expression 15]

$$p_{j,l}^{len} = \left\lfloor p_{j,l}^{PA} \times \left(\frac{p}{p_A}\right) \right\rfloor \quad (24)$$

Where, $S_M$ in Equation (22) is the number of rows of the mask matrix, and $\alpha$ is a constant of an arbitrary real number of "$0 \leq \alpha \leq 1$". Additionally, the second term of Equation (23) generally represents an integer to be added to or subtracted from the first term. This portion may be "random numbers equal to $((p/p_A) \times \alpha)$ or less".

With respect to the (1), there is a feature that it does not change if $p_{j,l}^{len}$ does not exceed p even when p changes, thereby, an effect that the distribution of the loop hardly changes is obtained.

Meanwhile, with respect to the (2), although a distribution of the loop does not change when p increases in integral multiples, there is an effect of complementing an intermediate value in the case of a multiple that cannot be divided by integral multiples.

For example, it is assumed that a certain LDPC codes are composed of a masking quasi-cyclic matrix H as following Equation (25) at $p_A = 10$.

[Numerical Expression 16]

$$H = \begin{bmatrix} I(1) & I(2) & I(3) & I(0) & 0 & 0 \\ I(2) & I(4) & I(6) & I(0) & I(0) & 0 \\ I(3) & I(6) & I(9) & 0 & I(0) & I(0) \end{bmatrix} \quad (25)$$

Here, in the case of following Equation (27), a necessary and sufficient condition for a quasi-cyclic matrix H' as shown in following Equation (26) to have loop $2i$ will result in following Equation (28).

[Numerical Expression 17]

$$H' := \begin{bmatrix} I(p_{0,0}) & I(p_{0,1}) & \ldots & I(p_{0,L-1}) \\ I(p_{1,0}) & I(p_{1,1}) & \ldots & I(p_{1,L-1}) \\ \vdots & \vdots & \ddots & \vdots \\ I(p_{J-1,0}) & I(p_{J-1,1}) & \ldots & I(p_{J-1,L-1}) \end{bmatrix} \quad (26)$$

[Numerical Expression 18]

$$\forall i, 2 \leq i, \forall j_k, 0 \leq j_k \leq J-1, \forall j_{k+1}, \quad (27)$$
$$0 \leq j_{k+1} \leq J-1, \forall 1_k, 0 \leq 1_k \leq L-1$$
$$j_0 = j_i, j_k \neq j_{k+1}, l_k \neq l_{k+1}$$

[Numerical Expression 19-1]

$$\sum_{k=0}^{i-1} \Delta_{j_k, j_{k+1}}(1_k) = 0 \bmod p \quad (28)$$

Incidentally, the $\Delta$ is following Equation (29).

[Numerical Expression 19-2]

$$\Delta_{j_k, j_{k+1}}(1_k) = p_{j_k,1} - p_{j_k+1,1} \quad (29)$$

Hence, considering to use this condition, it is understood that there is the loop 6 of $(1-2)+(6-9)+(6-2)=0$ in the Matrix H shown in Equation (25).

Meanwhile, when P=110 to $p_A=10$, it results in following Equation (30) if Equation (24) is applied. In this case, it becomes $(11-22)+(66-99)+(66-22)=0$ in the same position, and the distribution of the loop does not change, so that this method (Equation (24)) may be used in the sense that the distribution of the loop at the time of $p_A=10$ can be assured.

[Numerical Expression 20]

$$H_{p=110} = \begin{bmatrix} I(11) & I(22) & I(33) & I(0) & 0 & 0 \\ I(22) & I(44) & I(66) & I(0) & I(0) & 0 \\ I(33) & I(66) & I(99) & 0 & I(0) & I(0) \end{bmatrix} \quad (30)$$

However, considering that there is no numeric character other than multiples of $p/p_A$ when p is integral multiples of $p_A$, the loop can be further resolved if a value smaller than $p/p_A$ is added to a value of Equation (24), and thus a possibility that a distribution of large loops can be composed will increase. For example, when $\alpha = \frac{1}{4}$ is used in Equation (22), following Equation (31) is obtained, and it becomes $(11-22) \cdot (66-102) \cdot (67-22) = -2 \neq 0$ in the same position, so that conditions of the loop 6 are not satisfied.

[Numerical Expression 21]

$$H_{p=110} = \begin{bmatrix} I(11) & I(22) & I(33) & I(0) & 0 & 0 \\ I(22) & I(44) & I(66) & I(0) & I(0) & 0 \\ I(33) & I(67) & I(102) & 0 & I(0) & I(0) \end{bmatrix} \quad (31)$$

Meanwhile, since all the loops are specified by the multiples of $p/p_A$ in Equation (24), the probability that conditions to newly specify the small loops will occur becomes low if the second term of Equation (22) is small enough compared with $p/p_A$. Namely, it can be expected that the distribution of the loop will shift to a large value when Equation (22) is applied.

Fourth Embodiment

In a fourth embodiment, the LDPC codes corresponding to the encoding rates are configured using the irregular parity check matrix $H_M$ determined in the first to third embodiments.

Figure 11:
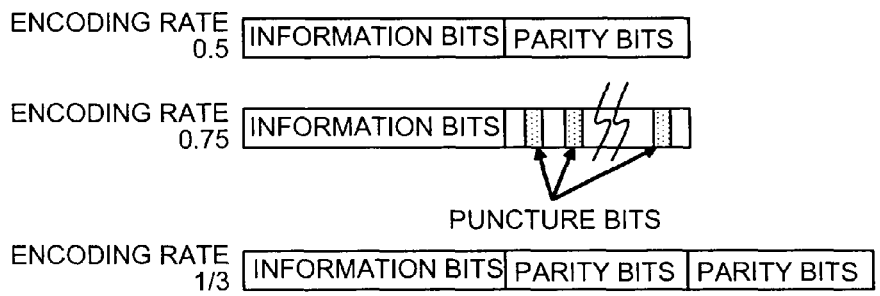
FIG. 11 is a view showing a code configuration method according to a fourth embodiment.

FIG. 11 is a view showing a code configuration method according to the present embodiment, wherein for example, codes of the encoding rate 0.5 are defined as a reference code, parity is punctured in generating a code of an encoding rate (=0.75) higher than that, and parity is added in generating a code of an encoding rate (=⅓) lower than that. Incidentally, what is necessary is to insert zero in the reception LLR to then perform a normal LDPC decoding to puncturing bits.

Figure 12:
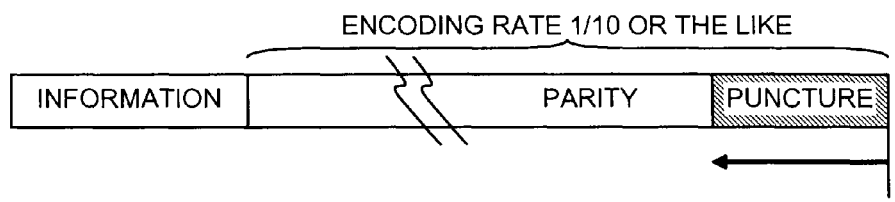
FIG. 12 is a view showing codes when the lowest encoding rate prepared by a system is $R_0=1/10$.

A construction method of the LDPC codes dealing with the encoding rates will be specifically explained here. For example, it is supposed that the lowest encoding rate prepared by the system is $R_0$=⅓ or less. FIG. 12 is a view showing codes when the lowest encoding rate prepared by the system is $R_0$=1/10, for example.

For example, when the codes corresponding to the encoding rate $R_0$=1/10 are stored in the memory, and codes of an encoding rate $R_1$ are constructed, if the encoding rate $R_1$ is less than ½, namely, if the encoding rate $R_1$ is between ½ to 1/10, the parity bits are punctured from the end of the code in order.

Meanwhile, when the encoding rate $R_1$ is higher than ½, a set r' of the puncturing bits of the LDPC codes is represented as follows. For example, assuming parity bits with a length r to the encoding rate $R_1$=K/(K+K/$2^{(l-1)}$) (1=2, 3, . . . ), the set r' of the puncturing bits can be represented as following Equation (32).

$$r' = r \setminus \{r(1:2^{(l-1)}:K)\} \quad (32)$$

Note that $\{r(1:2^{(l-1)}:K)\}$ shows elements from the first element to the K-th element of a set r at $2^{(l-1)}$ step, and Equation (32) means a set excluding the set $\{r(1:2^{(l-1)}:K)\}$ from the set r.

Hence, when puncturing 1 bit at a time, deletion is performed in order from an element behind an element to be $\{r(1:2^{(l-1)}:K)\} \setminus \{r(1:2^{(l-1+1)}:K)\}$ to the set $\{r(1:2^{(l-1)}:K)\}$, and it is removed from the set of r to be made a puncture bit. At this time, the puncture bits shown in FIG. 11, which are represented at intervals are rearranged so that they may be punctured from back in order.

As is understood, in the present embodiment, the code of the specific encoding rate is set as a reference, the puncture of the parity is performed with respect to the encoding rate higher than the reference code, whereas the parity is increased with respect to the low encoding rate, and at that time, the puncture processing and parity adding processing are achieved using one parity check matrix $H_M$ without individually generating the parity check matrix according to the encoding rate. As a result of this, it is possible to easily deal with the encoding rates, and it further becomes unnecessary to prepare the parity check matrix corresponding to the number of encoding rates, allowing the circuit scale to be greatly reduced.

Fifth Embodiment

In a fifth embodiment, applications of the LDPC codes to erasure correction codes will be described. While the LDPC codes explained so far are the error correcting codes with a type mounted in a physical layer of communication instruments, they can be utilized for the erasure correction codes as they are, thus description will be added henceforth.

In aiming at succeeding in the decode for an arbitrary code length and an encoding rate by the stochastically small number of received packets, the erasure correction codes based on the LDPC codes are suitable. Meanwhile, when the number of decodable erasure packets needs to be assured for the encoded packets, or when the number of burst erasure packets needs to be assured, erasure correction codes based on cyclic codes, such as BCH codes, become effective.

The codes for erasure correction are composed based on the LDPC codes according the present invention explained so far, or the general LDPC codes. Additionally, in the sense of assuring the number of erasure packets, they are composed based on Hamming codes, cyclic codes, BCH codes, or LDPC codes that can assure the minimum distance. These erasure correction codes can be utilized for wireless communications, cable communications using an optical fiber, a copper wire, or the like. Alternatively, when the encoded packets are distributedly stored on a disk, and some disk is damaged, it is also possible to reproduce it by the erasure correction codes. In this case, to a system that distributedly stores encoded packets in which data is erasure correction encoded into a packet unit (data packet) on different disks, it has a function, when the storage disk breaks partially, to reproduce only the encoded packets on the broken disk by collecting only the necessary minimum encoded packets separately stored. Additionally, when the data packets are partially updated, only the related minimum encoded packets are corrected.

An encoding decoding-method using algebraic codes, such as BCH codes, will be described in the present embodiment. Note that while subsequent descriptions will be described per packet, as for the processing, encoding decoding processing shall be performed in parallel per the same bit position within the packet.

First, as for codes generally defined by the check matrix, a treating method when the codes are used as the erasure correction codes will be shown. A binary check matrix $H_{ERA}$ with M-row N-columns of arbitrary linear codes is converted into a check matrix for erasure correction according to following procedures.

(1) $H_{ERA}$ is defined as following Equation (33) using an M×(N−M) matrix A, and an M×M matrix B.

$$H_{ERA} = [A|B]$$

$$B \neq 0 \quad (33)$$

(2) Conversion shown in following Equation (34) is performed using an inverse matrix $B^{-1}$ of B to thereby generate following Equation (35). Incidentally, I is a unit matrix of M×M.

$$H_{ERA}' = [B^{-1}A|B^{-1}B] = [B^{-1}A|I] \quad (34)$$

$$H_{ERA}^{L'} = [B^{-1}A] \quad (35)$$

(3) A parity packet $p=(p_1\ p_2\ \ldots\ p_M)$ is created as following Equation (36) to an information packet $u=(u_1\ u_2\ \ldots\ u_{N-M})$ using $H_{ERA}{}^{L'}$.

$$p^T = H_{ERA}' \times u^T \qquad (36)$$

Figure 13:
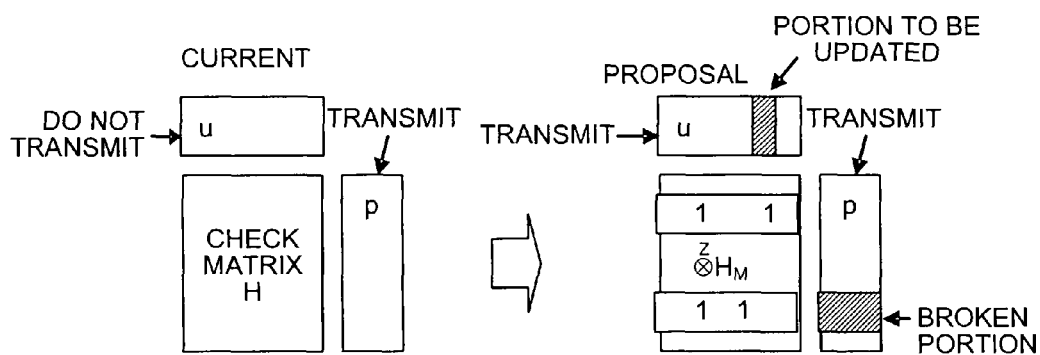
FIG. 13 is a view showing transmission processing of the conventional and present inventions.

(4) As a transmission packet, $v=(u|p)$ is sent as shown in FIG. 13, it is decoded by Gaussian elimination or the like on the reception-side. (5) The broken packet in the received packets is reproduced from a related information packet where "1" is set in H. (6) The related parity packet where "1" is set in H is corrected upon updating the data packet.

In the flow so far, a difference from the conventional method is a procedure that the information sequence u is not transmitted, but only the parity is transmitted in LT codes or Raptor codes, or the system used in the error correction encoding unit of "Japanese Patent Application 2005-101134".

Embodiment Using BCH Codes

When representing linear block codes, such as BCH codes, they are called (N, k) codes using a code length N and an information length k. Now, a check matrix of binary (7, 4) codes of the BCH codes is shown in following Equation (37) as an example.

[Numerical Expression 22]

$$H_{BCH} = \begin{bmatrix} 1110100 \\ 0111010 \\ 1101001 \end{bmatrix} \qquad (37)$$

From the procedure (1), following Equation (38) and following Equation (39) are obtained.

[Numerical Expression 23]

$$H_{BCH} = [A \mid B] = \begin{bmatrix} 1 & 1 & 1 & 0 & | & 1 & 0 & 0 \\ 0 & 1 & 1 & 1 & | & 0 & 1 & 0 \\ 1 & 1 & 0 & 1 & | & 0 & 0 & 1 \end{bmatrix} \qquad (38)$$

[Numerical Expression 24]

$$A = \begin{bmatrix} 1110 \\ 0111 \\ 1101 \end{bmatrix}, B = \begin{bmatrix} 100 \\ 010 \\ 001 \end{bmatrix} \qquad (39)$$

Incidentally, since $B=I$, $H_{BCH}'=[B^{-1}A|B^{-1}B]=[B^{-1}A|I]$ is already completed. Generally, it is required a work to perform the operation to thereby generate the unit matrix I.

Next, $H_{BCH}{}^{L'}=[B^{-1}A]$ is determined. Since $B=I$, $B^{-1}=I$ is obtained, resulting in $H_{BCH}{}^{L'}=[B^{-1}A]=[A]$. Similarly, if $G_{BCH}=[E|D]=[E^{-1}E|E^{-1}D]=[I|E^{-1}D]$ from the generator matrix $G_{BCH}$, $[E^{-1}D]^T=[B^{-1}A]=H_{BCH}$ is obtained, so that it may be determined from the generator matrix or a generating polynomial to define its generator matrix.

Meanwhile, an encoded packet is generated as $c=u\times G_{BCH}{}^T$ by using the generator matrix $G_{BCH}$ as it is, and a lower triangular matrix is included in $H_{BCH}'=[B^{-1}A|B^{-1}B]=[B^{-1}A|I]$ corresponding to an encoded packet $c_i$ that is successfully received, and thus the code $v=(u|p)$ is determined by backward substitution.

For example, when a product-sum operation is performed to $u=(u_1\ u_2\ u_3\ u_4)=(0\ 1\ 0\ 1)$ on GF (2) using the first row of A by the backward substitution, "$1\times 0+1\times 1+1\times 0+0\times 0=1$" is obtained, and to satisfy $H_{BCH}'\times v^T=0$, $p_1$ of a parity packet $p=(p_1\ p_2\ p_3)$ becomes $p_1=1$ using the first row of I from "$1+p_1\times 1=0$". The second row and the third row also become $p_2=0$ and $p_3=0$ using similar calculations.

Meanwhile, p can also be determined by $p^T=H_{ERA}{}^{L'}\times u^T$, those codes match with each other. Additionally, if success in receiving packet is "$u_1,\ u_2,\ p_2,\ p_3=0,\ 1,\ 0,\ 0$" upon decoding, $p_2,\ p_3$ of following Equation (40) correspond to the second row and the third row, respectively, and thus a matrix for calculation shown in following Equation (41) is prepared using those rows.

[Numerical Expression 25]

$$H_{ERA}^L = A = \begin{bmatrix} 1110 \\ 0111 \\ 1101 \end{bmatrix} \qquad (40)$$

[Numerical Expression 26]

$$\begin{bmatrix} 0 & 1 & 1 & 1 \\ 1 & 1 & 0 & 1 \end{bmatrix} \qquad (41)$$

This matrix is converted into a matrix described in following Equation (42) by applying the Gaussian elimination or the like thereto.

[Numerical Expression 27]

$$\begin{bmatrix} 1 & 0 & 1 & 0 \\ 1 & 1 & 0 & 1 \end{bmatrix} \qquad (42)$$

It is possible to solve "$u_3,\ u_4=0,\ 1$" by the backward substitution using "$u_1,\ u_2,\ p_2,\ p_3=0,\ 1,\ 0,\ 0$" from this matrix.

Meanwhile, an encoded packet is generated as $c=u\times G_{BCH}{}^T$ using the generator matrix $G_{BCH}$ as it is, and rows of $G_{BCH}{}^T$ corresponding to the encoded packet $c_i$ that is successfully received are collected, and thereafter, the Gaussian elimination or the like may be applied thereto. A portion of I of following Equation (43) is removed from a calculation object also in this case, and only the $E^{-1}D$ submatrix may be calculated in a manner similar to that described above.

[Numerical Expression 28]

$$G_{BCH}^T = \left[ \frac{I}{E^{-1}D} \right] \qquad (43)$$

According to the conventional system, since the information packet is not transmitted, a check matrix with 7-row×4-column is prepared to be applied to a communication channel with an equivalent error rate, and the Gaussian elimination for 4 rows must be performed if 4 packets among them are successfully received, resulting in a large calculation amount. Additionally, when a plurality of disks that store the packet do not break at one time like a distributed disc system, it can be self-reproduced only from a part of the encoded packets according to the procedure (5) without using all the encoded packets. For example, if it turns out that the parity packet $p_1$ is broken, it can be reproduced by $p_1=u_1+u_2+u_3$ using only the information packet "$u_1,\ u_2,\ u_3=0,\ 1,\ 0$" corresponding to the column where 1 is set in the first row of Equation (40).

Additionally, equivalent operations may be performed using the original parity check matrix shown in Equation (37).

For example, using the packets corresponding to the columns where 1 is set other than its own column in the row for the rows where 1 is set in the column corresponding to the erasure (broken) packet desired to be reproduced, when the packets other than its own packet corresponding to them are all normal, its own packet can be self-reproduced from the packet of the row weight-1. Hence, any methods may be used.

Further, also in the case of applications as the distributed disc system, when the contents in which a certain information packet is stored are updated, it is needed to encode all the disks again to be then distributed, conventionally. Since it is inefficient, a procedure of updating only the parity packet relevant to the updated data packet will be employed. For example, when $u_1$ is desired to be updated to Equation (40), what is necessary is to update only $p_1$, $p_3$ using $p_1=u_1+u_2+u_3$ and $p_3=u_1+u_2+u_4$. Although it seems that the calculation amount is not reduced so much in the example, the effect of the calculation amount is increased since the actual check matrix is further nondense. Equivalent operations may be performed using the original parity check matrix shown in Equation (37).

For example, the related parity is updated from the packet of row weight-1 using the packets corresponding to the columns where 1 is set other than its own column in the rows for the rows where 1 is set in the column corresponding to the information packet desired to be updated. Hence, any methods may be used.

All the operations can perform the erasure correction encoding decode using similar operations, if they are general linear codes (Hamming codes, cyclic codes, BCH codes, LDPC codes, convolutional codes, turbo codes, or the like).

Meanwhile, (n+1, k) linear codes formed by increasing a check symbol C of (n, k) linear codes C by 1 are called expansion codes of C. Particularly, for the binary (n, k) linear codes whose minimum distance is an odd number, the minimum distance can be increased by 1 by adding the check bit by 1 bit. For the purpose, what is necessary is just to add the check bit to each code so that weight may be even numbers. Namely, a check bit $p_A$ to satisfy following Equation (44) is added to a code $(w_1, w_2, \ldots, w_n)$, and codes C' to be a code $(w_1, w_2, \ldots, w_n, p_A)$ is formed. The check bit $p_A$ like this is called all parity check bit.

$$p_A = w_1 + w_2 + \ldots + w_n \quad (44)$$

The codes C' formed as described above are (n+1, k) linear codes in which, if a check matrix of the original codes is H, (n-k+1)×n matrix H' obtained by adding a column of 0 to all the components of H and by adding one row of 1 to all the components is a check matrix as shown in following Equation (45). The expansion codes in which the minimum distance is d+1 may be used for the erasure correction codes while using such codes.

[Numerical Expression 29]

$$H' = \begin{bmatrix} & & & 0 \\ & & & 0 \\ & H & & \vdots \\ & & & 0 \\ & & & 0 \\ 1 & 1 & \ldots & 1 & 1 & 1 \end{bmatrix} \quad (45)$$

Moreover, even when one added row has arbitrary elements in which 0 or 1 are mixedly present, it is possible to compose the codes after assuring the minimum distance d, and thus this configuration may be used.

(Application of Method for Expanding Minimum Distance)

Additionally, upon generating the generator matrix $G_{BCH}$, although a generating polynomial of the BCH codes, for example, in the case of the (7, 4) codes, $g(x)=x^3+x+1$ is used, a generator matrix $G'_{BCH}$ is generated using $g(x)'(=x^3+x+1)$ $(x+1)$ that is obtained by multiplying this $g(x)=x^3+x+1$ by $x+1$, an encoded packet is generated as $c=u \times G'_{BCH}{}^T$, rows of $G'_{BCH}{}^T$ corresponding to the encoded packet $c_i$ that is successfully received are collected, and thereafter, the Gaussian elimination or the like may be applied thereto. A portion of I of $G'_{BCH}{}^T=[I/E^{-1}D]$ is removed from a calculation object also in this case, and only the $E^{-1}D$ submatrix may be calculated in a manner similar to that described above. The codes using this $G'_{BCH}$ become the (n+1, k) codes of the minimum distance d+1 to $G_{BCH}$ of the (n, k) codes of the minimum distance d.

(Method of Preparation for Code Length)

If H", in which an arbitrary matrix E of n-k×z is connected with the check matrix H of the (n, k) codes with the minimum distance d, is connected as H"=[H|E], the (n+z, k) codes with the minimum distance d can be composed. The codes corresponding to actual parameters are composed using these techniques to thereby be used for the erasure correction.

(Effect of the System)

Figure 14:
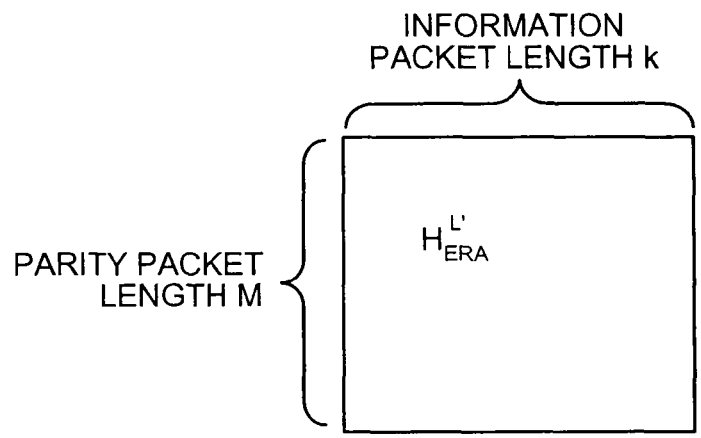
FIG. 14 is a view showing $H_{ERA}^{L'}$ in which an information packet length k=N−M is a column size and a parity packet length M is a row size.

According to the present invention, the code v=(u|p) including both the information sequence and the parity sequence can be transmitted using $H_{ERA}{}^{L'}$, and decoding can be executed if a total number of information packets u' that are successfully received and parity packets p' that are successfully received is collected by about "the number of packets of u×105%". Namely, it is possible to decode $H_{ERA}{}^{L'}$, in which the information packet length k=N-M is a column size and the parity packet length M is a row size shown in FIG. 14, by the Gaussian elimination, PCC that is the system proposed in the error correction encoding unit of "Japanese Patent Application 2005-101134" polynominal combinatorial computation (PCC), or the like, if the parity packets "p'=(the number of packets of u×105%)-k" are collected.

According to the conventional system, the information packet is not transmitted, so that when it applies to a communication channel with an equivalent error rate, the check matrix with 7-row×4-column is prepared as the check matrix, and the Gaussian elimination for 4 rows must be performed if 4 packets among them are successfully received in the embodiment, resulting in a large calculation amount. The calculation amount can be reduced compared with this conventional example.

Additionally, when the BCH codes are used, "encoded packet N: information packet k: correctable packet d-1 (d: minimum distance)" can be decided as follows.

Encoded packet N: Information packet k: Correctable packet d-1 (d: minimum distance) or the like.
7:4:2
15:11:2
15:7:4
15:5:6
31:26:2
31:21:4
31:16:6
31:11:10
31:6:14
63:57:2
63:51:4
63:45:6

63:39:8
63:36:10
63:30:12
63:24:14
63:18:20
127:120:2
127:113:4
127:106:6
127:99:8
127:92:10
127:85:12
127:78:14
127:71:18
127:64:20
255:247:2
255:239:4
255:231:6
255:223:8
255:215:10
255:207:12
255:199:15
255:191:16

Consequently, there is a merit that can assure the number of erasable packets d−1. Namely, it is possible to certainly perform the correction even when d−1 packets are erased. Moreover, when 1-bit expansion codes of the BCH codes are used, Encoded packet N: Information packet k: Correctable packet d−1 (d: minimum distance) or the like.
8:4:3
16:11:3
16:7:5
16:5:7
32:26:3
32:21:5
32:16:7
32:11:11
32:6:15
64:57:3
64:51:5
64:45:7
64:39:9
64:36:11
64:30:13
64:24:15
64:18:21
128:120:3
128:113:5
128:106:7
128:99:9
128:92:11
128:85:13
128:78:15
128:71:19
128:64:21
256:247:3
256:239:5
256:231:7
256:223:9
256:215:11
256:207:13
256:191:17

Consequently, there is a merit that the number of erasable packets d−1 can be assured. Namely, it is possible to certainly perform the correction even when d−1 packets are erased. Similar effects are applicable to all of them if they are the codes in which the minimum distance d is assured.

Meanwhile, when neither the code length nor the information length matches with the requirement as described above, there is a method of padding an information part with known data.

For example, to set an information length k' to about 100 at a code length n'=150, the information part is padded with known 0s of 105 (pcs) or the like using
255:207:12 As a result,
150:102:12
is obtained. Since it is only padded with the known value, the number of packets that can be corrected does not change.

The cyclic codes, such as the BCH codes, can also be used for a method of showing a similar effect after shortened the codes. In this case, in order not to lose features of the cyclic codes, it is common to shorten from the left end of the encoded packets except for continuous information packets. In this case, a check matrix corresponding to the information packet excluding the check matrix is deleted.

Additionally, when a method of the expansion codes is used for this,
256:207:13
in which the code length is +1, and the correctable number of packets is +1 can be formed. In this case, when the information part is padded with the known 0s of 106 (pcs) or the like,
150:101:13
can be formed.

Further, in the case of the cyclic codes such as the BCH codes, since it is correctable even when N-K packets that all continue are erased, there is a merit that error correction capability against burst errors can also be assured. Additionally, reproduction and update can be performed using a part of packets also for self-reproduction or updating, so that there is a merit that it becomes unnecessary to form the encoded packets using all the information packets as before. This does a similar effect also by the 1-bit expansion codes. When it is limited to a single burst error, it is correctable even when N-K packets are erased also in shortening cyclic codes.

Sixth Embodiment

Figure 15:
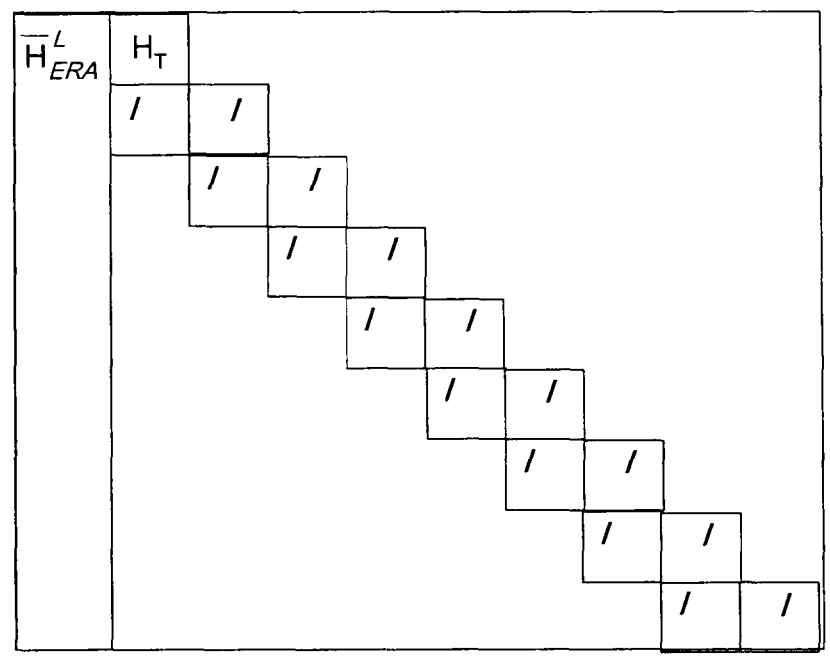
FIG. 15 is a view showing a configuration of the parity check matrix $H_M$ of LDPC codes according to a sixth embodiment.

Subsequently, an efficient erasure correction encoding decoding method using the LDPC codes according to the present invention will be shown. FIG. 15 is a view showing a configuration of the parity check matrix $H_M$ of the LDPC codes according to the present embodiment. When $H_T$ has a configuration, in which diagonal matrices with the row weight of 2 are arranged in a staircase manner, as shown in Equation (19).

(First Step)

A row of $H_M$ corresponding to the first row of $H_T$ where 1 is set in a column at the $T_D$ left end and the second row of $H_M$ are added. Next, addition is similarly continued to a column where 1 is set in the second one. Submatrices of $T_D$ are converted into unit matrices by repeating this operation (conversion from FIG. 16-1 to FIG. 16-2).

(Second Step)

Next, $H_T$ that has become "Dual Diagonal" is processed in a manner similar to that of the first step (conversion from FIG. 16-2 to FIG. 16-3). Since it can be converted into a form of $H_M=[A|I]$ with these operations, $H_{ERA}^{L'}=[A]$ can be easily created. The code length and the encoding rate of the LDPC codes become changeable, so that there is an effect that excellent performance may be obtained in each code length and encoding rate, and a similar effect is obtained also for the erasure correction code, and it becomes possible to satisfy all the merits shown in the fifth embodiment.

This conversion method is applicable to all of them using a part of or all of the steps as far as the LDGM structure in which the row weight of the lower triangular matrix is 2. Meanwhile, even when the row weight is 2 or more, it is applicable by repeating similar operations by the number of times of weight.

Additionally, an encoded packet is generated as $c=ux$ $G_{BCH}{}^T$ by using the generator matrix $G_M=[I|A]$ as it is, rows of $G_{BCH}{}^T$ corresponding to the encoded packet $c_i$ that is successfully received are collected, and thereafter, the Gaussian elimination or the like may be applied thereto. A portion of I of $G_{BCH}{}^T=[I/A]$ is removed from a calculation object also in this case, and only the submatrix A may be calculated in a manner similar to that described above.

Seventh Embodiment

Figure 17:
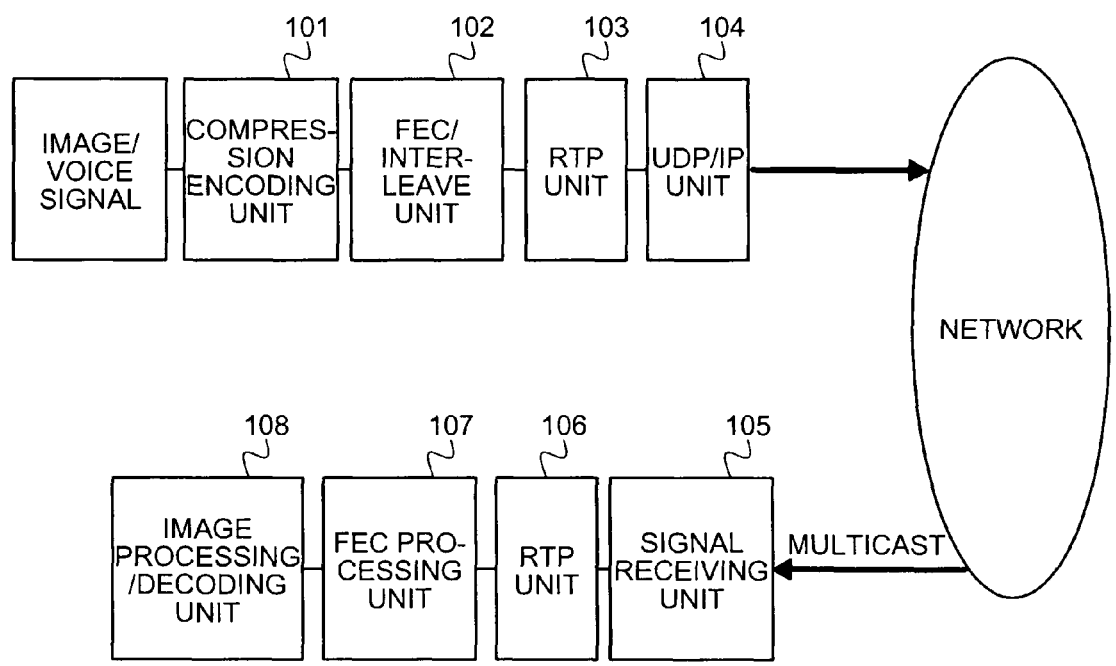
FIG. 17 is a view showing a configuration example of an IP-based streaming system according to a seventh embodiment.

FIG. 17 is a view showing a configuration example of an IP-based streaming system according to a seventh embodiment, wherein the transmission-side of an image/voice signal is provided with a compression encoding unit 101, a forward error correction (FEC)/interleave unit 102, a real-time transfer protocol (RTP) unit 103, and a user datagram protocol (UDP)/IP unit 104, and the reception-side thereof is provided with a signal receiving unit 105, an RTP unit 106, an FEC processing unit 107, and an image processing/decoding unit 108. Note that FEC means an error correction encoding decoding unit, RTP is a real time image transmission protocol, and UDP/IP is an IP protocol that attaches importance to real time nature.

Figure 18:
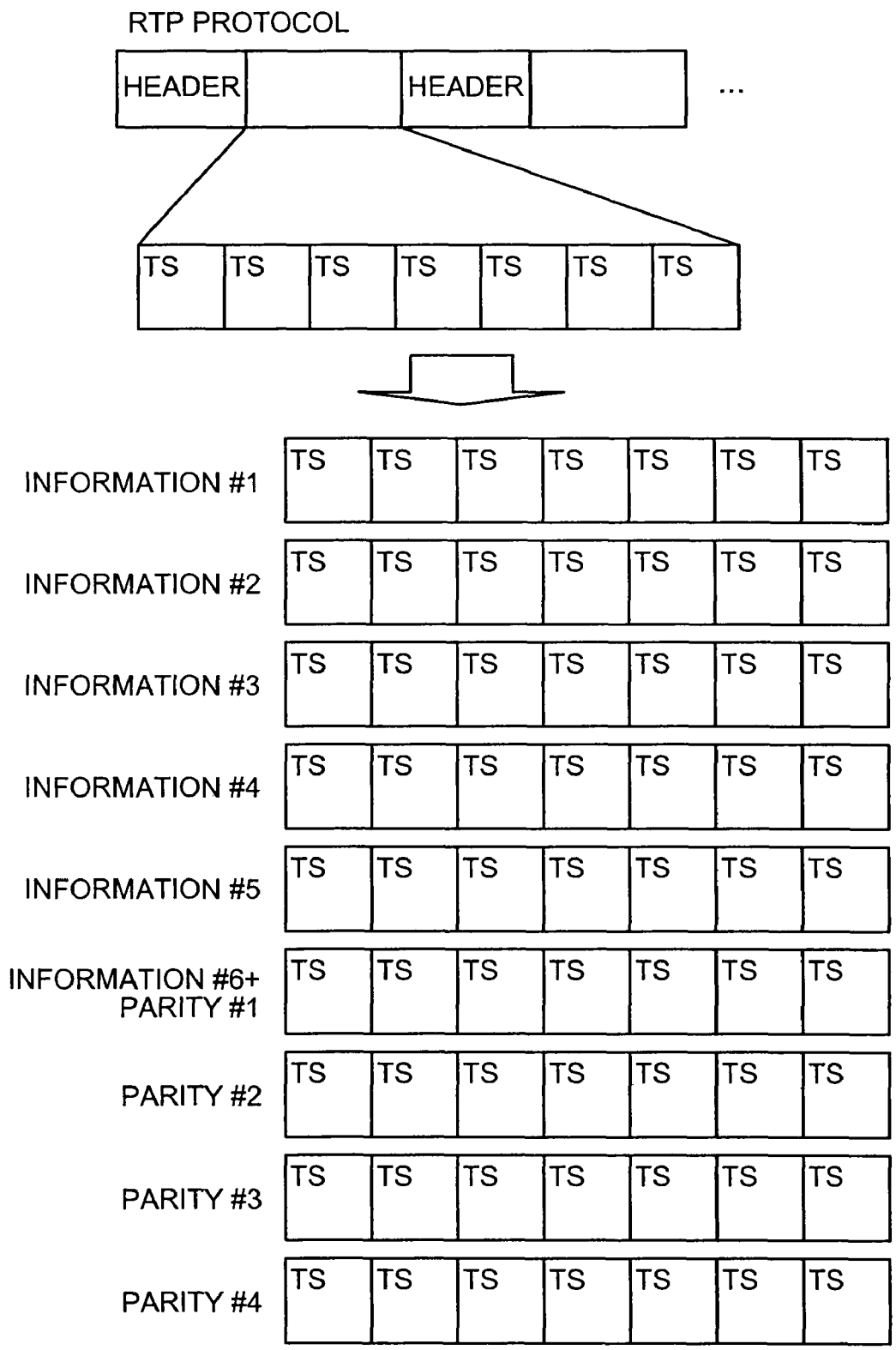
FIG. 18 is a view showing an RTP protocol.

Hereinafter, the RTP protocol relevant to FEC will be explained using FIG. 18. An RTP packet includes about seven transport stream (TS) packets as shown in FIG. 18, an information RTP packet is composed of about 5 RTP packets, and the parity packet is added thereto by 1 to several packets (depending on the case, tens of packets) depending on the error rate.

For example, when the BCH codes "n:k:d−1=63:36:10" of the fifth embodiment is used, "5 RTP packets (each seven TS packets)+1 TS packet" (total 36 TS packets) are composed of the information packets "6 TS packets+3 RTP packets (each seven TS packets)" (total 27 TS packets). In this case, correction can be made until the erasure of random 10 TS packets or continuous 27 TS packets.

For example, when they are reduced by 1 packet using the expansion codes "n:k:d−1=64:36:11" of the BCH codes of the fifth embodiment, "n:k:d−1=63:35:11" is obtained. In this case, it can be composed of the information packet of 5 RTP packets (total 35 packets), and the parity packet of 4 RTP packets (total 28 packets). Additionally, correction can be made until the erasure of random 11 TS packets.

The parameter of other BCH codes, the LDPC codes, and all other linear codes can be applied to this erasure correction code. In addition to that, it is applicable to all the applications that perform the erasure correction per packet and disk.

Eighth Embodiment

Subsequently, a system to which the encoding processing/decoding processing according to the first to seventh embodiments is applied will be is explained. For example, the LDPC encoding processing and decoding processing according to the present invention can apply to whole telecommunication equipment, such as mobile communications (terminal, base station), wireless LAN, optical communications, satellite communications, a quantum encryption device, and specifically, the LDPC encoder 1 (corresponding to the first to fourth embodiments) and the LDPC decoder 5, which are shown in FIG. 1, an erasure correction encoding function described in the fifth embodiment, and an erasure correction encoding decoding function described in the sixth embodiment are installed on each telecommunication equipment to thereby perform the error correction.

Figure 19:
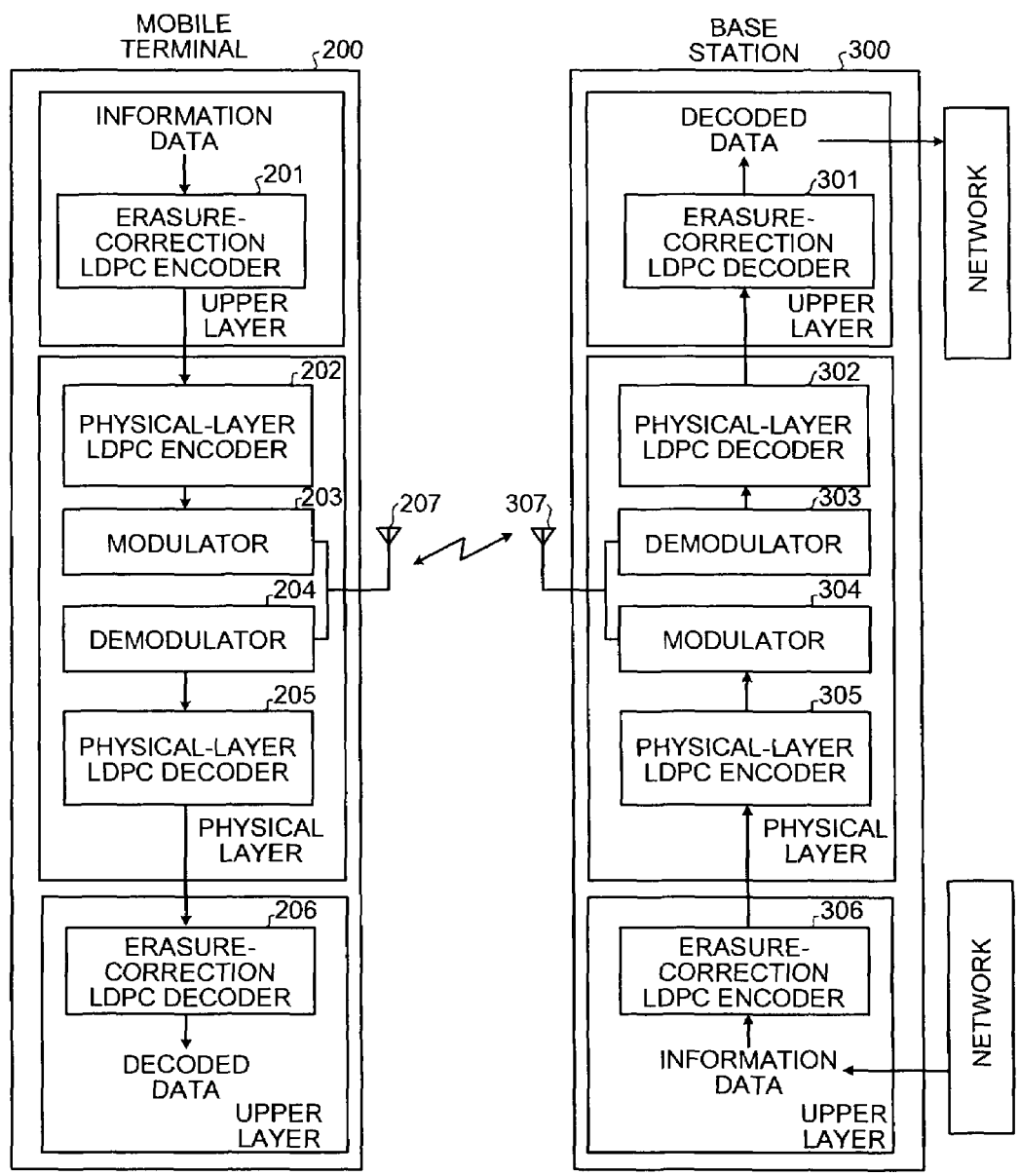
FIG. 19 is a view showing a configuration example when encoding processing/decoding processing according to the present invention to a mobile communications system.
Figures 20, 21:
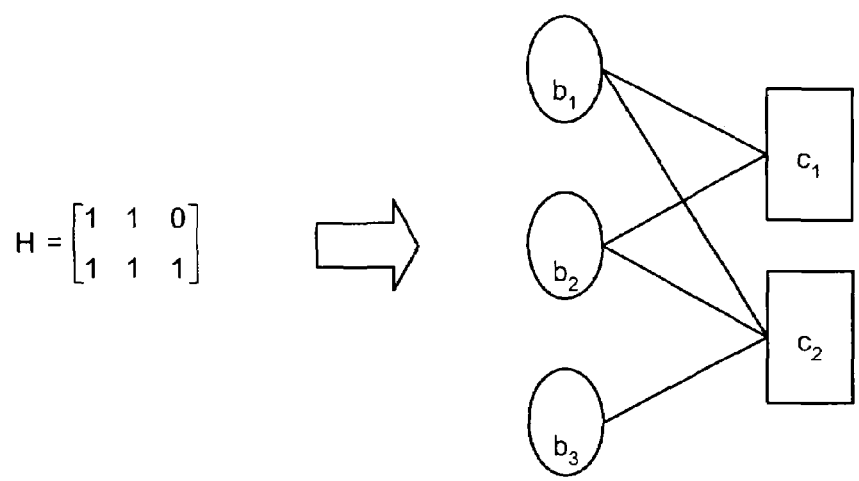
FIG. 20 is a view showing an example of a parity check matrix of QC codes.
FIG. 21 is a view showing a case in which one example of the check matrix is represented by a Tanner graph.

FIG. 19 is a view showing a configuration example when the encoding processing/decoding processing according to the present invention is applied to a mobile communications system provided with a mobile terminal 200 and a base station 300 that communicates with the mobile terminal 200, wherein the mobile terminal 200 is provided with an erasure-correction LDPC encoder 201, a physical-layer LDPC encoder 202, a modulator 203, a demodulator 204, a physical layer LDPC decoder 205, an erasure-correction LDPC decoder 206, and an antenna 207, and the base station 300 is provided with an erasure-correction LDPC decoder 301, a physical layer LDPC decoder 302, a demodulator 303, a modulator 304, a physical-layer LDPC encoder 305, an erasure-correction LDPC encoder 306, and an antenna 307.

Moreover, in the mobile terminal 200 and the base station 300 shown in FIG. 19, the physical-layer LDPC encoders and the physical layer LDPC decoders applied to fading communication channels or the like are incorporated in the physical layers, and the erasure-correction LDPC encoders and the erasure-correction LDPC decoders are incorporated in upper layers of data link layers or the like. Incidentally, one of the configurations of the LPDC encoders explained in the first to fourth embodiments is applied to the physical-layer LDPC encoders of the mobile terminal 200 and the base station 300. Meanwhile, the encoding function and the decoding function described in the fifth and sixth embodiments are applied to the erasure-correction LDPC encoders and erasure-correction LDPC decoders of the mobile terminal 200 and the base station 300.

When data is transmitted from the mobile terminal 200 in the mobile communications system composed as described above, first, information data, such as voice, mail, and WEB, is packetized as data, for example, to then encode it by the erasure-correction LDPC encoder 201. Next, in the physical layer, the physical-layer LDPC encoder 202 for fading communication channel encodes this packet data unit. This encoded data is sent out to a radio communication channel via the modulator 203 and the antenna 207.

Meanwhile, in the base station 300, received signals including errors generated in the radio communication channel are received via the antenna 307 and the demodulator 303, and received data after demodulation is corrected by the physical-layer LDPC decoder 302 for the physical layer. In the physical layer, whether the error correction is successfully performed per packet is then notified to the upper layer. In the upper layer, the erasure-correction LDPC decoder 301 reproduces the information packet using only the packets whose error correction is succeeded. Subsequently, this information packet is transmitted to a communication destination via the network. Note that also when the mobile terminal 200 receives various data from the network, the base station 300 transmits the encoded data to the mobile terminal 200, and the mobile terminal 200 reproduces the various data, by the processing similar to that described above. When the base station 300 transmits the encoded data to the mobile terminal 200, first, information data, such as voice, mail, and WEB, is packetized as data, for example, to then encode it by the erasure-correction LDPC encoder 306. Next, the physical-layer LDPC encoder 305 for fading communication channel encodes this packet data unit in the physical layer. This encoded data is sent out to the radio communication channel via the modulator 304 and the antenna 307. Meanwhile, in the mobile terminal 200, received signals including errors generated in the radio communication channel are received via the antenna 207 and the demodulator 204, the received data after demodulation is corrected by the physical layer LDPC decoder 205. In the physical layer, whether the error correction is successfully performed per packet is then notified to the upper layer. In the upper layer, the erasure-correction LDPC decoder 206 reproduces the information packet using only the packets whose error correction is succeeded.

INDUSTRIAL APPLICABILITY

As described above, the check-matrix generating method and encoding method according to the present invention are useful as the encoding technology in digital communications, and are particularly suitable for the communication apparatuses that employ the LDPC codes as the encoding system.

The invention claimed is:

1. A method of generating a parity check matrix for low-density parity check codes, the method comprising:
   quasi-cyclic matrix generating including generating a regular quasi-cyclic matrix with uniform weights of a row and a column, in which cyclic permutation matrices are arranged in a row direction and a column direction and specific regularity is given to the cyclic permutation matrices;
   mask-matrix generating including generating a mask matrix for making the regular quasi-cyclic matrix into irregular with nonuniform weights of a row and a column, the mask matrix being capable of supporting a plurality of encoding rates;
   masking including converting a specific cyclic permutation matrix in the regular quasi-cyclic matrix into a zero-matrix using a mask matrix corresponding to a specific encoding rate to generate an irregular masking quasi-cyclic matrix; and
   check-matrix generating, by a communication apparatus, including generating an irregular parity check matrix with a low-density generation matrix structure in which the masking quasi-cyclic matrix and a matrix in which the cyclic permutation matrices are arranged in a staircase manner are arranged in a predetermined location.

2. The method according to claim 1, further comprising providing, in the specific cyclic permutation matrices, a specific regularity of $p_{j,l}=j(l+1)\mod p$ to $p_{j,l}$ of a cyclic permutation matrix $I(p_{j,l})$ with p-row×p-column arranged at a row index j ($0 \leq j \leq J-1$), and a column index l ($0 \leq l \leq L-1$), where $I(p_{j,l})$ is a cyclic permutation matrix in which a position of a row index r ($0 \leq r \leq p-1$) and a column index $(r+p_{j,l})\mod p$ is 1, and other positions are 0.

3. The method according to claim 1, further comprising providing, in the specific cyclic permutation matrices, a specific regularity of $p_{j,l}=(j+1)(l+1)\mod p$ to $p_{j,l}$ of a cyclic permutation matrix $I(p_{j,l})$ with p-row×p-column arranged at a row index j with $0 \leq j \leq J-1$) and a column index l with $0 \leq l \leq L-1$, where $I(p_{j,l})$ is a cyclic permutation matrix in which a position of a row index r ($0 \leq r \leq p-1$) and a column index $(r+p_{j,l})\mod p$ is 1, and other positions are 0.

4. The method according to claim 1, further comprising providing, in the specific cyclic permutation matrices, a specific regularity of $p_{j,l}=p_{0,1}(J+1)\mod p$ to $p_{j,l}$ of a cyclic permutation matrix $I(p_{j,l})$ with p-row×p-column arranged at a row index j with $0 \leq j \leq J-1$ and a column index l with $0 \leq l \leq L-1$, where $I(p_{j,l})$ is a cyclic permutation matrix in which a position of a row index r ($0 \leq r \leq p-1$) and a column index $(r+p_{j,l})\mod p$ is 1, and other positions are 0.

5. The method according to claim 4, wherein
   firstly, a value of $p_{0,L-1}$ is changed from 1 to p−1 based on the irregular parity check matrix with the low-density generation matrix structure to obtain $p_{0,L-1}$ in which the minimum loop is maximized and the number of the minimum loops is minimized,
   secondly, a value of $p_{0,L-2}$ is changed from 1 to p−1 to obtain $p_{0,L-2}$ in which the minimum loop is maximized and the number of the minimum loops is minimized, and
   thirdly, $p_{0,L-3}$, $p_{0,L-4}$, and $p_{0,L-5}$ are obtained in order by repeating the above processing, and lastly, a value of $p_{0,0}$ is changed from 1 to p−1 to obtain $p_{0,0}$ in which the minimum loop is maximized and the number of the minimum loops is minimized.

6. The method according to claim 1, further comprising providing, in the specific cyclic permutation matrices, a specific regularity of $p_{j,l}=((p-p_{0,1})(J+1))\mod p$ to $p_{j,l}$ of a cyclic permutation matrix $I(p_{j,l})$ with p-row×p-column arranged at a row index j ($0 \leq j \leq J-1$) and a column index l ($0 \leq l \leq L-1$), where $I(p_{j,l})$ is a cyclic permutation matrix in which a position of a row index r ($0 \leq r \leq p-1$) and a column index $(r+p_{j,l})\mod p$ is 1, and other positions are 0.

7. The method according to claim 6, wherein
   firstly, a value of $p_{0,L-1}$ is changed from 1 to p−1 based on the irregular parity check matrix with the low-density generation matrix structure to obtain $p_{0,L-1}$ in which the minimum loop is maximized and the number of the minimum loops is minimized,
   secondly, a value of $p_{0,L-2}$ is changed from 1 to p−1 to obtain $p_{0,L-2}$ in which the minimum loop is maximized and the number of the minimum loops is minimized, and
   thirdly, $p_{0,L-3}$, $p_{0,L-4}$, and $p_{0,L-5}$ are obtained in order by repeating the above processing, and lastly, a value of $p_{0,0}$ is changed from 1 to p−1 to obtain $p_{0,0}$ in which the minimum loop is maximized and the number of the minimum loops is minimized.

8. The method according to claim 1, wherein the mask-matrix generating includes
   degree-distribution calculating including
      firstly, calculating a column degree distribution of a first mask matrix corresponding to a first encoding rate that becomes a reference,
      secondly, calculating a column degree distribution of a second mask matrix corresponding to a second encoding rate with next lower encoding rate using the column degree distribution of the first mask matrix as constraints, and
      thirdly, as required, calculating column degree distributions of a third mask matrix, a fourth mask matrix, and so on in order using the column degree distribution of a previous mask matrix as constraints, and
   weight-position determining including determining weight positions of columns of the mask matrix from the first mask matrix with the highest encoding rate in order, based on a column degree distribution of a corresponding mask matrix.

9. The method according to claim 8, wherein the weight-position determining includes
   performing mask-matrix generation processing separately to columns with a large column degree and columns with a small column degree based on a probability of errors resulting from the small column degree,
   determining weight positions of the columns of the mask matrix for the columns with the large column degree to satisfy a first condition that an interval between weights in the same column is separated by two or more rows, and determining weight positions of the columns of the mask matrix for the columns with the small column degree to satisfy the first condition and a second condition that an arrangement is performed based on a random number.

10. The method according to claim 9, wherein the weight-position determining includes, to satisfy the second condition,
generating a random number sequence by a predetermined method, generating, if there are elements having a difference therebetween is unity in the random number sequence, a pseudo-random number sequence in which the difference between the elements is two or more by moving one element to the last of the random number sequence, and
dividing the pseudo-random number sequence for every column degree to define a row position number of a column weight.

11. The method according to claim 8, wherein the weight-position determining includes arranging the columns of the mask matrix in a descending order of the column degree in the column degree distribution.

12. The method according to claim 8, further comprising using each mask matrix after the second mask matrix while shifting submatrices of the first mask matrix so that the same pattern is be formed in a column direction.

13. The method according to claim 1, wherein a size of the cyclic permutation matrix is set to be variable to deal with an arbitrary code length.

14. A method of encoding predetermined information bits using a parity check matrix for low-density parity check codes, the method comprising:
encoding, by an encoder, the predetermined information bits using an irregular parity check matrix generated by
generating a regular quasi-cyclic matrix with uniform weights of a row and a column, in which cyclic permutation matrices are arranged in a row direction and a column direction and specific regularity is given to the cyclic permutation matrices,
generating a mask matrix for making the regular quasi-cyclic matrix into irregular with nonuniform weights of a row and a column, the mask matrix being capable of supporting a plurality of encoding rates,
converting a specific cyclic permutation matrix in the regular quasi-cyclic matrix into a zero-matrix using a mask matrix corresponding to a specific encoding rate to generate an irregular masking quasi-cyclic matrix, and
generating an irregular parity check matrix with a low-density generation matrix structure in which the masking quasi-cyclic matrix and a matrix in which the cyclic permutation matrices are arranged in a staircase manner are arranged in a predetermined location.

15. The method according to claim 14, further comprising:
setting an encoding rate ½ as a reference;
puncturing a parity in generating a code of an encoding rate higher than the encoding rate ½; and
adding a parity in generating code of an encoding rate lower than the encoding rate ½.

16. The method according to claim 14, further comprising:
puncturing, in a state where a code corresponding to a specific encoding rate lower than the encoding rate ½ is stored in a memory, if an encoding rate at a time of transmission is between ½ and the specific encoding rate, parity bits of the code in order from the end of the code; and
puncturing, if the encoding rate at the time of transmission is higher than ½, parity bits of the code in order from the end of the code up to the encoding rate ½, and thereafter, puncturing puncturing-bits at a constant interval until it reaches the encoding rate at the time of the transmission.

17. The method according to claim 16, further comprising:
rearranging the puncturing-bits with the regular interval to the end of the code; and
puncturing the puncturing-bits after the rearrangement in order from the end.

18. A method of performing erasure correction encoding of predetermined information bits, the method comprising:
generating, by a communication apparatus, erasure correction codes using an irregular masking quasi-cyclic matrix generated by
generating a regular quasi-cyclic matrix with uniform weights of a row and a column, in which cyclic permutation matrices are arranged in a row direction and a column direction and specific regularity is given to the cyclic permutation matrices,
generating a mask matrix for making the regular quasi-cyclic matrix into irregular with nonuniform weights of a row and a column, the mask matrix being capable of supporting a plurality of encoding rates,
converting a specific cyclic permutation matrix in the regular quasi-cyclic matrix into a zero-matrix using a mask matrix corresponding to a specific encoding rate to generate an irregular masking quasi-cyclic matrix, and
generating an irregular parity check matrix with a low-density generation matrix structure in which the masking quasi-cyclic matrix and a matrix in which the cyclic permutation matrices are arranged in a staircase manner are arranged in a predetermined location.

19. A communication apparatus that generates a parity check matrix for low-density parity check codes, wherein
an irregular parity check matrix with a low-density generation matrix structure is generated by
generating a regular quasi-cyclic matrix with uniform weights of a row and a column, in which cyclic permutation matrices are arranged in a row direction and a column direction and specific regularity is given to the cyclic permutation matrices,
generating a mask matrix for making the regular quasi-cyclic matrix into irregular with nonuniform weights of a row and a column, the mask matrix being capable of supporting a plurality of encoding rates,
converting a specific cyclic permutation matrix in the regular quasi-cyclic matrix into a zero-matrix using a mask matrix corresponding to a specific encoding rate to generate an irregular masking quasi-cyclic matrix, and
generating an irregular parity check matrix with a low-density generation matrix structure in which the masking quasi-cyclic matrix and a matrix in which the cyclic permutation matrices are arranged in a staircase manner are arranged in a predetermined location.

20. A communication system that employs low-density parity check codes as an error correction code, the communication system comprising:
a transmission apparatus that encodes predetermined information bits using an irregular parity check matrix generated by
generating a regular quasi-cyclic matrix with uniform weights of a row and a column, in which cyclic permutation matrices are arranged in a row direction and a column direction and specific regularity is given to the cyclic permutation matrices, generating a mask matrix for making the regular quasi-cyclic matrix into irregular with nonuniform weights of a row and a column, the mask matrix being capable of supporting a plurality of encoding rates, converting a specific cyclic permutation matrix in the regular quasi-cyclic matrix into a zero-matrix using a mask matrix corresponding to a specific encoding rate to generate an irregular masking quasi-cyclic matrix, and generating an irregular parity check matrix with a low-density generation matrix structure in which the masking quasi-cyclic matrix and a matrix in which the cyclic permutation matrices are arranged in a staircase manner are arranged in a predetermined location; and a reception apparatus that decodes a code by a well-known processing.

21. An encoder that encodes predetermined information bits using a parity check matrix for low-density parity check codes, the encoder comprising:

an encoding unit that encodes the predetermined information bits using an irregular parity check matrix generated by generating a regular quasi-cyclic matrix with uniform weights of a row and a column, in which cyclic permutation matrices are arranged in a row direction and a column direction and specific regularity is given to the cyclic permutation matrices, generating a mask matrix for making the regular quasi-cyclic matrix into irregular with nonuniform weights of a row and a column, the mask matrix being capable of supporting a plurality of encoding rates, converting a specific cyclic permutation matrix in the regular quasi-cyclic matrix into a zero-matrix using a mask matrix corresponding to a specific encoding rate to generate an irregular masking quasi-cyclic matrix, and generating an irregular parity check matrix with a low-density generation matrix structure in which the masking quasi-cyclic matrix and a matrix in which the cyclic permutation matrices are arranged in a staircase manner are arranged in a predetermined location.

* * * * *